US011410728B2

(12) United States Patent
Shimura

(10) Patent No.: US 11,410,728 B2
(45) Date of Patent: Aug. 9, 2022

(54) SEMICONDUCTOR STORAGE DEVICE THAT PERFORMS A VERIFICATION OPERATION IN A SELECTIVE MANNER

(71) Applicant: KIOXIA CORPORATION, Tokyo (JP)

(72) Inventor: Yasuhiro Shimura, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/004,680

(22) Filed: Aug. 27, 2020

(65) Prior Publication Data
US 2021/0295919 A1    Sep. 23, 2021

(30) Foreign Application Priority Data
Mar. 17, 2020  (JP) .............................. JP2020-046688

(51) Int. Cl.
| | |
|---|---|
| *G11C 16/06* | (2006.01) |
| *G11C 16/10* | (2006.01) |
| *G11C 16/04* | (2006.01) |
| *G11C 16/34* | (2006.01) |
| *H01L 27/11556* | (2017.01) |
| *H01L 27/11582* | (2017.01) |
| *H01L 25/065* | (2006.01) |

(52) U.S. Cl.
CPC .......... *G11C 16/10* (2013.01); *G11C 16/0483* (2013.01); *G11C 16/3459* (2013.01); *H01L 25/0657* (2013.01); *H01L 27/11556* (2013.01); *H01L 27/11582* (2013.01); *H01L 2225/06506* (2013.01); *H01L 2225/06562* (2013.01)

(58) Field of Classification Search
CPC . G11C 16/10; G11C 16/0483; G11C 16/3459; H01L 27/11582; H01L 25/0657; H01L 27/11556; H01L 2225/06506; H01L 2225/06562
USPC ....................................................... 365/185.17
See application file for complete search history.

(56) References Cited

U.S. PATENT DOCUMENTS

| | | | |
|---|---|---|---|
| 7,948,804 B2 | 5/2011 | Komatsu | |
| 8,432,732 B2 | 4/2013 | Li et al. | |
| 8,570,802 B2 | 10/2013 | Shirakawa | |
| 9,666,296 B1 | 5/2017 | Maejima | |
| 9,881,674 B2 * | 1/2018 | Sakui | G11C 16/0483 |
| 2016/0172041 A1 * | 6/2016 | Sakui | G11C 16/30 |
| | | | 365/185.12 |

(Continued)

FOREIGN PATENT DOCUMENTS

JP   2017-157260 A   9/2017

*Primary Examiner* — Tha-O H Bui
(74) *Attorney, Agent, or Firm* — Kim & Stewart LLP

(57) ABSTRACT

A semiconductor storage device includes first and second memory strings, a word line, first and second select gate lines, and a control circuit. The first memory string includes a first memory transistor and a first select transistor. The second memory string includes a second memory transistor and a second select transistor. The word line is connected to the first and second memory transistors. The control circuit is connected to the word line and the first and second select gate lines. The control circuit is configured to perform, during a write sequence, a program operation on each of the first and second memory transistors in turn and a verify operation on only one of the first and second memory transistors.

20 Claims, 23 Drawing Sheets

(56) References Cited

U.S. PATENT DOCUMENTS

| | | | |
|---|---|---|---|
| 2018/0190363 A1* | 7/2018 | Lee | G11C 16/10 |
| 2018/0277220 A1* | 9/2018 | Nakagawa | G11C 11/5671 |
| 2019/0279719 A1* | 9/2019 | Lee | G11C 16/16 |
| 2020/0303400 A1* | 9/2020 | Arai | H01L 27/11582 |

* cited by examiner

US 11,410,728 B2

SEMICONDUCTOR STORAGE DEVICE THAT PERFORMS A VERIFICATION OPERATION IN A SELECTIVE MANNER

CROSS-REFERENCE TO RELATED APPLICATION(S)

This application is based upon and claims the benefit of priority from Japanese Patent Application No. 2020-046688, filed on Mar. 17, 2020, the entire contents of which are incorporated herein by reference.

FIELD

Embodiments described herein relate generally to a semiconductor storage device.

BACKGROUND

A semiconductor storage device which includes a plurality of memory strings of memory transistors and select transistors connected in series, word lines connected to a memory transistor, a select gate lines connected to the select transistors. A control circuit of the semiconductor storage device is connected to the word lines and the select gate lines.

DETAILED DESCRIPTION

Figure 1:
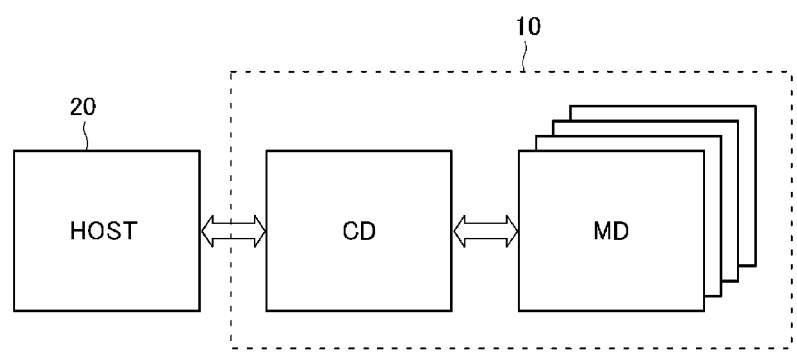
FIG. 1 is a schematic block diagram illustrating a configuration of a memory system according to a first embodiment.

Embodiments provide a semiconductor storage device capable of executing writing with high speed and high reliability.

In general, according to an embodiment, a semiconductor storage device includes first and second memory strings, a word line, first and second select gate lines, and a control circuit. The first memory string includes a first memory transistor and a first select transistor. The second memory string includes a second memory transistor and a second select transistor. The word line is connected to the first and second memory transistors. The first select gate line is connected to the first select transistor. The second select gate line extends in a same layer level as the first select gate line, and is connected to the second select transistor. The control circuit is connected to the word line and the first and second select gate lines. The control circuit is configured to perform, during a write sequence, a program operation on each of the first and second memory transistors, respectively, and a verify operation on only one of the first and second memory transistors.

Hereinafter, a semiconductor storage device according to certain example embodiments will be described with reference to the drawings. The following embodiments are merely examples, and are not intended to limit the present disclosure. The following drawings are schematic, and for convenience of description, certain parts or aspects of a configuration may be omitted. The common portions in different embodiments will be denoted by the same reference symbols, and additional descriptions thereof may be omitted.

In the present disclosure, the term "semiconductor storage device" may refer to a memory die or may refer to a memory system including a control die, such as a memory chip, a memory card, or a solid state drive (SSD). The term "semiconductor storage device" may also refer to a combination of components including a host computer, such as a smart phone, a tablet terminal, or a personal computer.

In the present disclosure, when a first component is "electrically connected" to a second component, the first component may be directly connected to the second component, or the first component may be connected to the second component via wiring, a semiconductor member or a transistor. For example, when three transistors are connected in series, a first transistor is "electrically connected" to a third transistor even though a second transistor is in an OFF state.

In the present disclosure, when a first component is "connected between" a second component and a third component, this refers to the first component, the second component, and the third component being connected in series, and the first component is provided in a current path from the second component to the third component.

In the present disclosure, when a circuit or the like "electrically connects" two wirings or the like to each other, this may mean that the circuit or the like includes a transistor or the like, and the transistor or the like is provided in a current path between two wirings so that the transistor or the like can be turned ON.

In the present disclosure, a one direction parallel to an upper surface of a substrate is referred to as an X direction, another direction parallel to the upper surface of the substrate and perpendicular to the X direction is referred to as a Y direction, and a direction orthogonal to the upper surface of the substrate is referred to as a Z direction. The X and Y directions may be referred to as surface directions of the substrate, and the Z direction may be referred to a thickness direction of the substrate.

In the present disclosure, in some cases, one direction along a plane is referred to as a first direction, another direction along the plane but intersecting the first direction is referred to as a second direction, and a direction intersecting with the plane is referred to as a third direction. The first direction, the second direction and the third direction may or may not correspond to the X direction, the Y direction, and the Z direction depending on context.

In the present disclosure, descriptive expressions such as "upper" or "lower" are based references to the substrate. For example, a direction going further away from the substrate along the Z direction is referred to as upward direction, and a direction getting closer to the substrate along the Z direction is referred to as going in a lower direction. A lower surface or a lower end of a certain component means a surface or an end portion of the component closer or closest to the substrate, and an upper surface or an upper end of a certain component means a surface or an end portion of the component farther (farthest) away from to the substrate. A surface of a component that intersects an X-Y direction plane can be referred to as a side surface or the like.

In the present disclosure, a "width" or a "thickness" of a component, a member or the like in some direction may mean a width or a thickness of a cross-section or the like taken along the direction as such would be observed by scanning electron microscopy (SEM), transmission electron microscopy (TEM), or the like.

In the present disclosure, a "radial direction" of a member, a through hole or the like having a cylindrical or annular shape may mean a direction going closer to the central axis or a direction going away from the central axis in a plane perpendicular to the central axis of this cylinder or ring. Further, the "thickness in the radial direction" or the like for an annual or ring shaped component refers to a difference between a distance from the central axis to the inner peripheral surface and a distance from the central axis to the outer peripheral surface in the same plane.

First Embodiment

[Memory System 10]

FIG. 1 is a schematic block diagram illustrating a configuration of a memory system 10 according to a first embodiment.

The memory system 10 performs reading, writing, erasing or the like of user data according to a signal transmitted from a host computer 20. The memory system 10 is, for example, a memory chip, a memory card, an SSD or other systems capable of storing user data. The memory system 10 includes a plurality of memory dies MD that stores user data, and a control die CD connected to the plurality of memory dies MD and the host computer 20. The control die CD includes, for example, a processor, a RAM, etc., and performs processing such as conversion between logical addresses and physical addresses, bit error detection/correction, garbage collection (compaction), or wear leveling.

Figure 2:
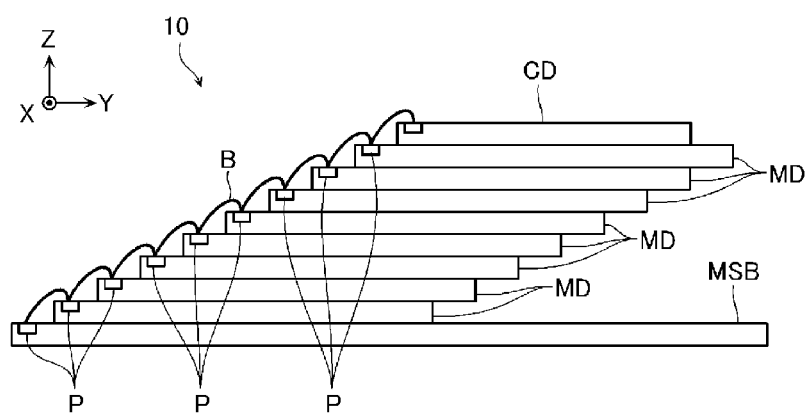
FIG. 2 illustrates a schematic side view of a memory system according to a first embodiment.
Figure 3:
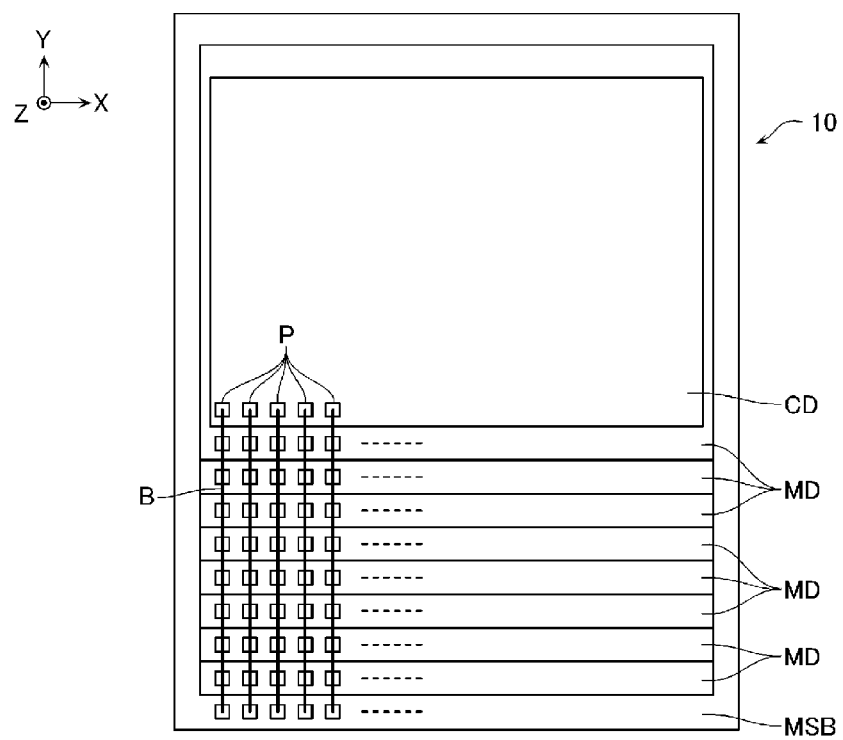
FIG. 3 illustrates a schematic plan view of a memory system according to a first embodiment.

FIG. 2 illustrates a schematic side view of a configuration example of the memory system 10 according to the present embodiment. FIG. 3 illustrates a schematic plan view of the same configuration example. For the convenience of description, FIGS. 2 and 3 omit a part of the configuration.

As illustrated in FIG. 2, the memory system 10 according to the present embodiment includes a mounting board MSB, a plurality of memory dies MD stacked on the mounting board MSB, and a control die CD stacked on the memory dies MD. A pad electrode P is provided in the end region of the upper surface of the mounting board MSB in the Y direction, and a portion of the other region is connected to the lower surface of the memory die MD via an adhesive, etc. A pad electrode P is provided in the end region of the upper surface of the memory die MD in the Y direction, and the other region is connected to the lower surface of another memory die MD or the control die CD via an adhesive, etc. A pad electrode P is provided in the end region of the upper surface of the control die CD in the Y direction.

As illustrated in FIG. 3, each of the mounting board MSB, the memory dies MD, and the control die CD includes pad electrodes P arranged in the X direction. The pad electrodes P provided on the mounting board MSB, the memory dies MD, and the control die CD are connected to each other via bonding wires B.

The configurations illustrated in FIGS. 2 and 3 are merely examples, and specific configurations may be adjusted. For example, in the example illustrated in FIGS. 2 and 3, the control die CD is stacked on the plurality of memory dies MD, and these components are connected to each other by the bonding wires B. In this configuration, the memory dies MD and the control die CD are provided in one package. Alternatively, the control die CD may be provided in a package separate from the memory dies MD. The memory dies MD and the control die CD may be connected to each other by through-electrodes or the like rather than through the bonding wires B.

[Circuit Configuration of Memory Die MD]

Figure 4:
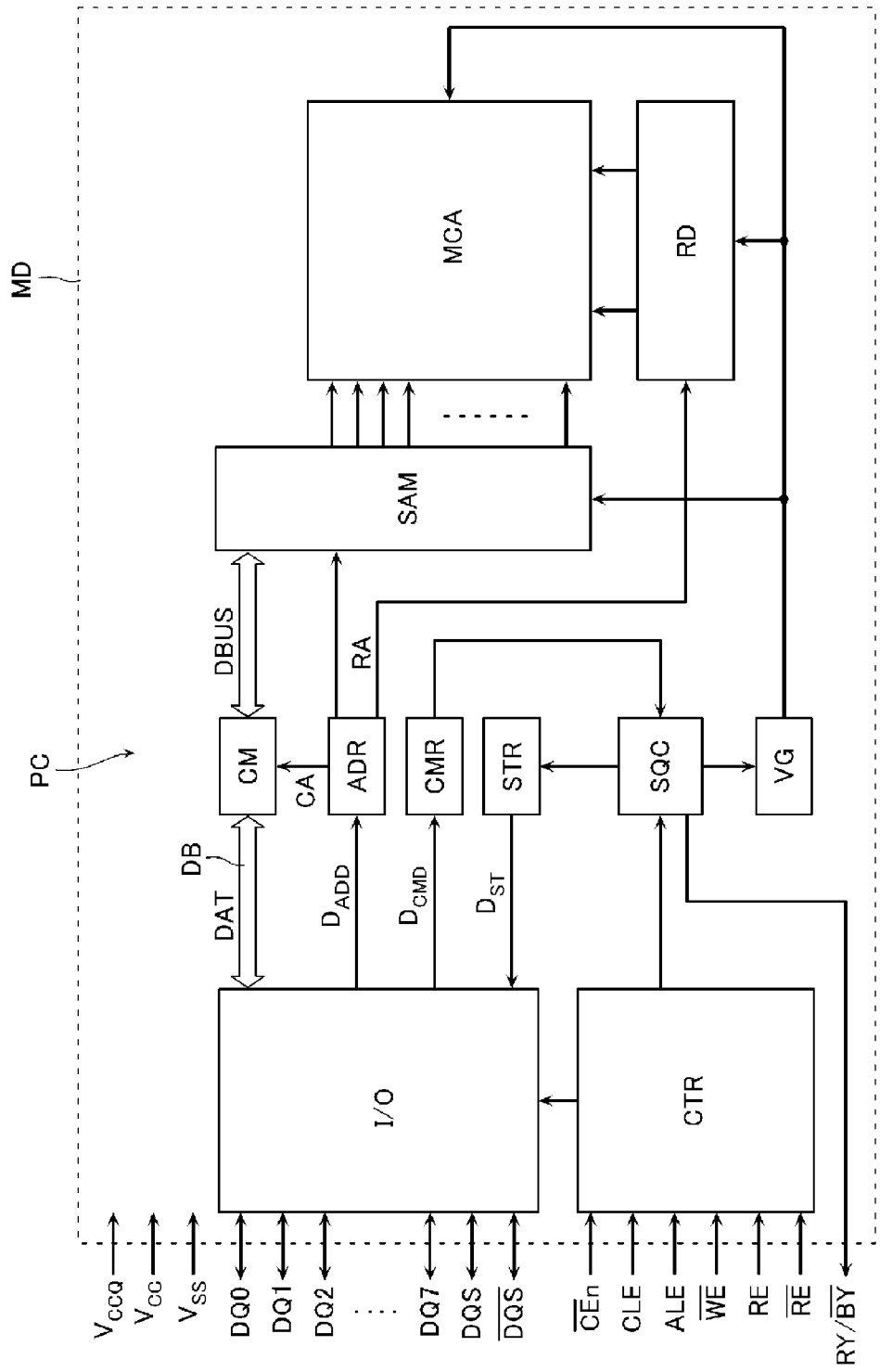
FIG. 4 is a schematic block diagram of a memory die according to a first embodiment.
Figure 5:
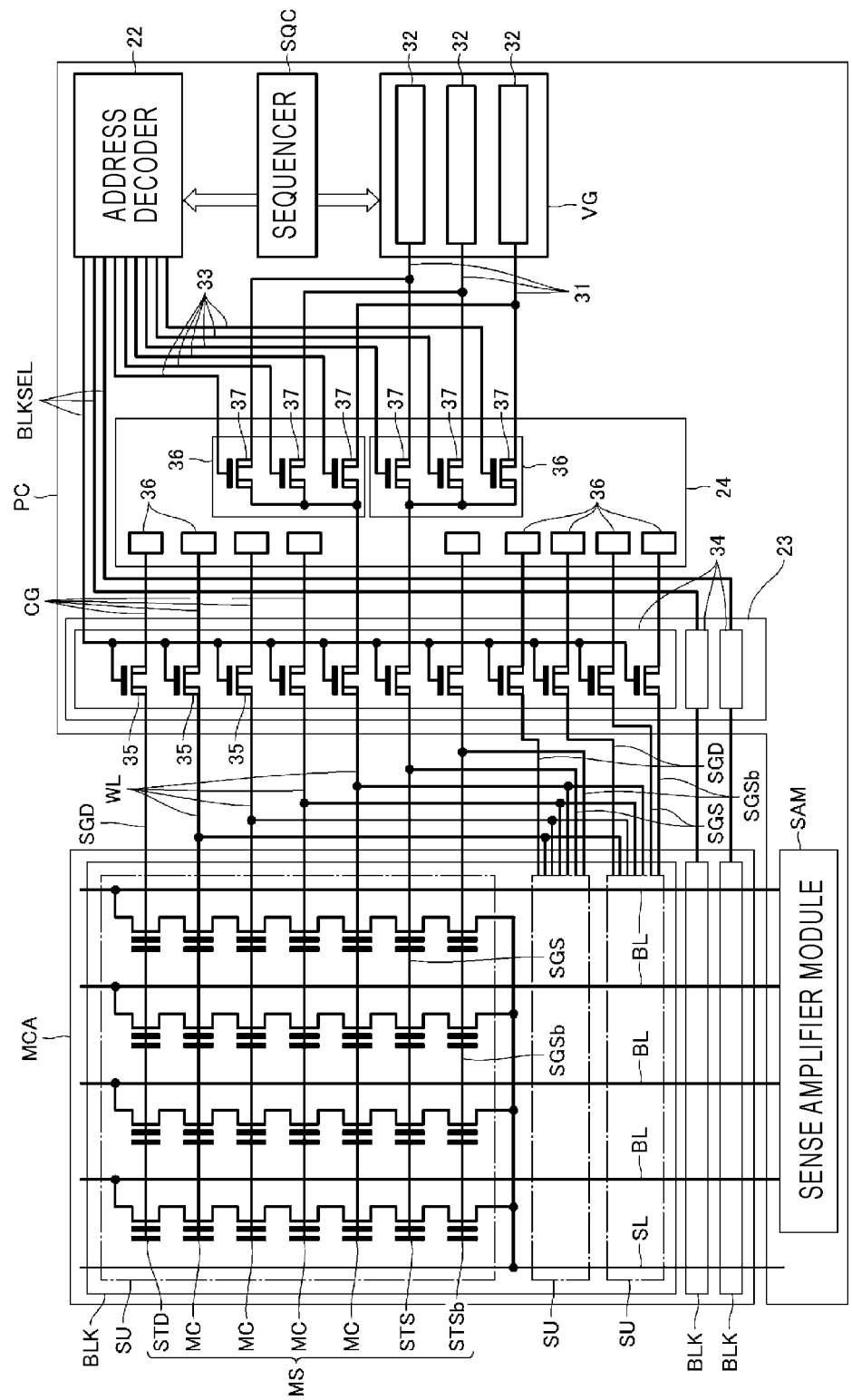
FIG. 5 is a schematic circuit diagram illustrating aspects of a memory die according to a first embodiment.

FIG. 4 is a schematic block diagram illustrating a configuration of the memory die MD according to the first embodiment. FIG. 5 is a schematic circuit diagram illustrating a part of the configuration of the memory die MD.

FIG. 4 illustrates a plurality of control terminals. The plurality of control terminals (page-left side) represented as control terminals corresponding to various input signals and the like. The input signals may be a high active signal (positive logic signal), may be a low active signal (negative logic signal), or may be both a high active signal and a low active signal. In FIG. 4, the reference symbols of the control terminals corresponding to a high active signal include an overline marking (upper bar). In the present disclosure, reference symbols of control terminals corresponding to the low active signal includes a slash ("/").

As illustrated in FIG. 4, the memory die MD includes a memory cell array MCA that stores data, and a peripheral circuit PC connected to the memory cell array MCA. The peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

[Circuit Configuration of Memory Cell Array MCA]

As illustrated in FIG. 5, the memory cell array MCA includes a plurality of memory blocks BLK. Each of the memory blocks BLK includes a plurality of string units SU. Each of the string units SU includes a plurality of memory strings MS. Ends of the memory strings MS on a same side are connected to the peripheral circuit PC through bit lines BL, respectively. The other ends of the memory strings MS are connected to the peripheral circuit PC through a common source line SL.

Each memory string MS includes a drain-side select transistor STD, a plurality of memory cells MC (memory transistors), a source-side select transistor STS, and a source-side select transistor STSb which are connected in series between the bit line BL and the source line SL. Hereinafter, the drain-side select transistor STD, the source-side select transistor STS, and the source-side select transistor STSb may be simply referred to as select transistors STD, STS, and STSb.

The memory cell MC is a field effect transistor that includes a semiconductor layer functioning as a channel region, a gate insulating film including a charge storage film, and a gate electrode. The threshold voltage of the memory cell MC changes according to a charge amount in the charge storage film. The memory cell MC stores data of 1 bit or a plurality of bits. The gate electrodes of the memory cells MC corresponding to one memory string MS are connected to word lines WL, respectively. Each of the word lines WL is commonly connected to all memory strings MS in one memory block BLK.

Each of the select transistors STD, STS, and STSb is a field effect transistor that includes a semiconductor layer functioning as a channel region, a gate insulating film, and a gate electrode. The gate electrodes of the select transistors STD, STS, and STSb are connected to select gate lines SGD, SGS, and SGSb, respectively. The drain-side select gate line SGD is provided corresponding to the string unit SU, and is connected to all memory strings MS of a string unit SU. The source-side select gate line SGS is connected in common to all memory strings MS in the plurality of string units SU. The source-side select gate line SGSb is connected in common to all memory strings MS in the plurality of string units SU.

[Circuit Configuration of Peripheral Circuit PC]

For example, as illustrated in FIG. 5, the voltage generation circuit VG (FIG. 4) is connected to a plurality of voltage supply lines 31. The voltage generation circuit VG includes, for example, a step-down circuit such as a regulator and a step-up circuit such as a charge pump circuit 32. The step-down circuit and the step-up circuit are connected to voltage supply lines through which a power voltage $V_{CC}$ and a ground voltage $V_{SS}$ (FIG. 4) are supplied, respectively. These voltage supply lines are connected to, for example, the pad electrodes P described with reference to FIGS. 2 and 3. The voltage generation circuit VG generates a plurality of operating voltages to be applied to the bit lines BL, the source line SL, the word lines WL and the select gate lines SGD, SGS, and SGSb, during the read operation, the write operation and the erase operation for the memory cell array MCA according to, for example, a control signal from the sequencer SQC, and outputs the operating voltages to the plurality of voltage supply lines 31 at once. The operating voltages output from the voltage supply lines 31 are properly adjusted according to control signals from the sequencer SQC.

For example, as illustrated in FIG. 5, the row decoder RD (FIG. 4) includes an address decoder 22 that decodes address data $D_{ADD}$, and a block selection circuit 23 and a voltage selection circuit 24 that transfer an operating voltage to the memory cell array MCA according to an output signal of the address decoder 22.

The address decoder 22 includes a plurality of block selection lines BLKSEL and a plurality of voltage selection lines 33. The address decoder 22 sequentially refers to, for example, row addresses RA in the address register ADR (FIG. 4) according to a control signal from the sequencer SQC, decodes a row address RA, turns ON a predetermined block select transistor 35 and a predetermined voltage select transistor 37 corresponding to the row address RA, and turns OFF the other block select transistors 35 and the other voltage select transistors 37. For example, voltages of a predetermined block selection line BLKSEL and a predetermined voltage selection line 33 are set to the "H" state, and the other voltages are set to the "L" state. When a P channel type transistor is used instead of an N channel type, reverse voltages are applied to these wirings.

In the illustrated example, the address decoder 22 includes one block selection line BLKSEL for one memory block BLK. However, this configuration is properly changeable. For example, one block selection line BLKSEL may be provided for two or more memory blocks BLK.

The block selection circuit 23 includes a plurality of block selectors 34 corresponding to the memory blocks BLK, respectively. Each of the block selectors 34 includes a plurality of block select transistors 35 corresponding to the word lines WL and the select gate lines SGD, SGS, and SGSb, respectively. The block select transistor 35 is, for example, a field effect breakdown voltage transistor. Each of drain electrodes of the block select transistors 35 is electrically connected to the corresponding word line WL or the corresponding select gate line SGD, SGS, or SGSb. Each of source electrodes is electrically connected to the voltage supply lines 31 through a wiring CG and the voltage selection circuit 24. Gate electrodes are commonly connected to the corresponding block selection line BLKSEL.

The block selection circuit 23 further includes a plurality of transistors (not illustrated). These transistors are field effect breakdown voltage transistors connected between the select gate lines SGD, SGS, and SGSb and the voltage supply line through which a ground voltage $V_{SS}$ is supplied. These transistors supply a ground voltage $V_{SS}$ to the select gate lines SGD, SGS, and SGSb in a non-selected memory block BLK. The plurality of word lines WL in the non-selected memory block BLK goes into a floating state.

The voltage selection circuit 24 includes a plurality of voltage selectors 36 corresponding to the word lines WL and the select gate lines SGD, SGS, and SGSb. Each of the voltage selectors 36 includes a plurality of voltage select transistors 37. The voltage select transistor 37 is, for example, a field effect breakdown voltage transistor. Each of drain terminals of the voltage select transistors 37 is electrically connected to the corresponding word line WL or the corresponding select gate line SGD, SGS, or SGSb through the wiring CG and the block selection circuit 23. Each of source terminals is electrically connected to the corresponding voltage supply line 31. Each of gate electrodes is connected to the corresponding voltage selection line 33.

The sense amplifier module SAM includes, for example, a plurality of sense amplifier units corresponding to the plurality of bit lines BL. Each sense amplifier unit includes a sense amplifier connected to the bit line BL. The sense amplifier includes a sense circuit connected to the bit line BL, a voltage transfer circuit connected to the bit line BL, and a latch circuit connected to the sense circuit and the voltage transfer circuit. The sense circuit includes a sense transistor that is turned ON according to a voltage or a current of the bit line BL, and a wiring that is charged or discharged according to the ON/OFF state of the sense transistor. The latch circuit latches data of "1" or "0" according to a voltage of the wiring. The voltage transfer circuit electrically connects the bit line BL to either of two types of voltage supply lines according to data latched by the latch circuit.

The cache memory CM (FIG. 4) includes a plurality of latch circuits connected to the latch circuits within the sense amplifier module SAM via a wiring DBUS. Data DAT in the plurality of latch circuits are sequentially transferred to the sense amplifier module SAM or the input/output control circuit I/O.

A decoding circuit and a switch circuit (not illustrated) are connected to the cache memory CM. The decoding circuit decodes a column address CA stored in the address register ADR (FIG. 4). The switch circuit electrically connects a latch circuit corresponding to the column address CA to a bus DB (FIG. 4) according to an output signal of the decoding circuit.

The sequencer SQC outputs an internal control signal to the row decoder RD, the sense amplifier module SAM, and the voltage generation circuit VG according to command data $D_{CMD}$ stored in the command register CMR. The sequencer SQC properly outputs status data $D_{ST}$ indicating its own state to the status register STR. The sequencer SQC generates a ready/busy signal, and outputs the generated ready/busy signal to a terminal RY//BY. The terminal RY//BY is implemented by, for example, the pad electrodes P described with reference to FIGS. 2 and 3.

The input/output control circuit I/O includes data signal input/output terminals DQ0 to DQ7, clock signal input/output terminals DQS and /DQS, and an input circuit (such as a comparator) and an output circuit (such as an off chip driver (OCD) circuit) which are connected to the data signal input/output terminals DQ0 to DQ7. The input/output circuit I/O includes a shift register and a buffer circuit connected to the input circuit and the output circuit. The input circuit, the output circuit, the shift register, and the buffer circuit are connected to terminals to which a power voltage $V_{CCQ}$ and a ground voltage $V_{SS}$ are supplied, respectively. The data signal input/output terminals DQ0 to DQ7, the clock signal input/output terminals DQS and /DQS, and the terminal to which the power voltage $V_{CCQ}$ is supplied are implemented by, for example, the pad electrodes P described with reference to FIGS. 2 and 3. Data input through the data signal input/output terminals DQ0 to DQ7 is output to the cache memory CM, the address register ADR, or the command register CMR from the buffer circuit according to an internal control signal from the logic circuit CTR. Data output through the data signal input/output terminals DQ0 to DQ7 is input to the buffer circuit from the cache memory CM or the status register STR according to an internal control signal from the logic circuit CTR.

The logic circuit CTR (FIG. 4) receives an external control signal from the control die CD through external control terminals/CEn, CLE, ALE, /WE, RE, and /RE, and accordingly outputs an internal control signal to the input/output control circuit I/O. The external control terminals/CEn, CLE, ALE, /WE, RE, and /RE are implemented by, for example, the pad electrodes P described with reference to FIGS. 2 and 3.

[Structure of Memory Die MD]

Figure 6:
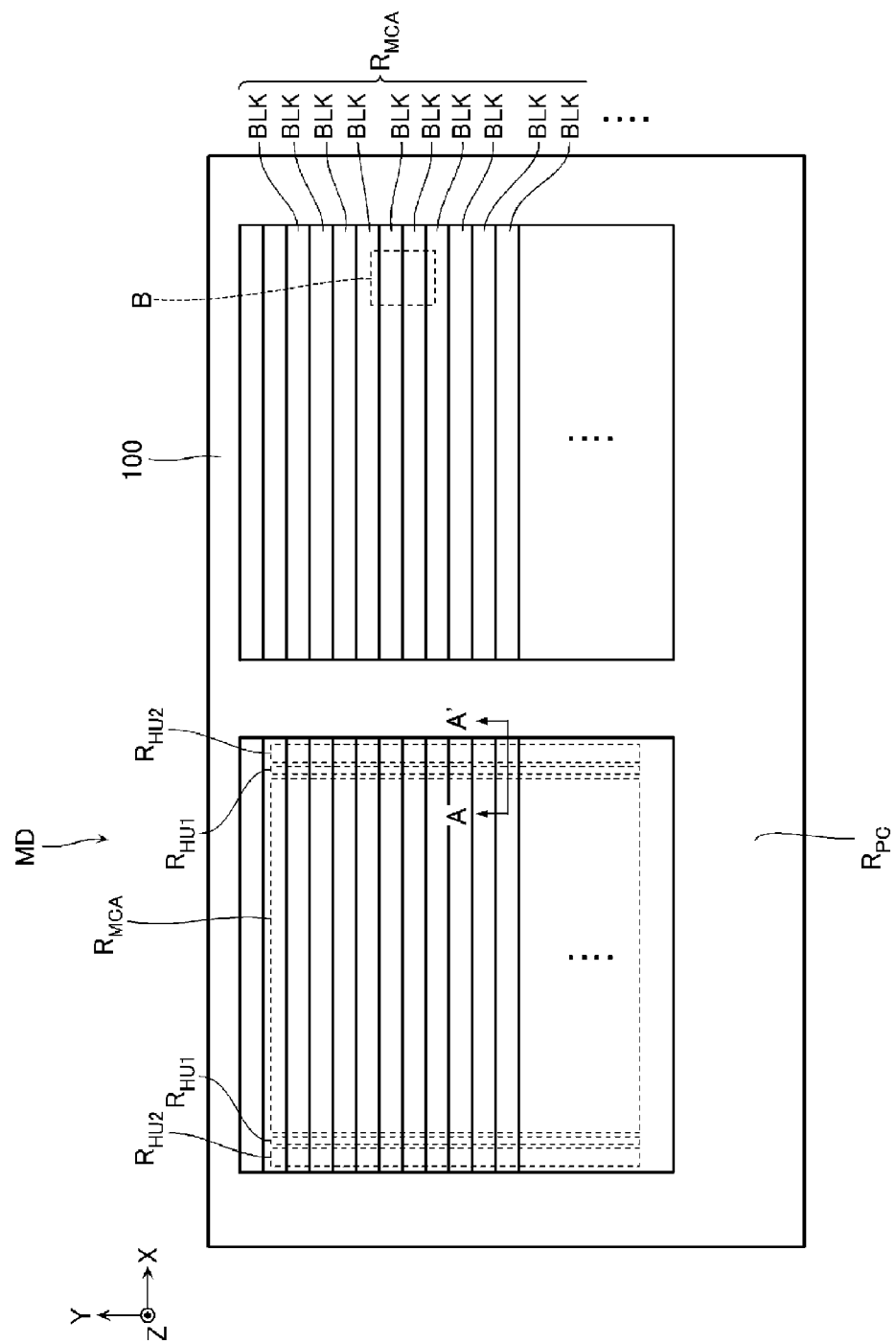
FIG. 6 illustrates a schematic plan view of a memory die according to a first embodiment.
Figure 7:
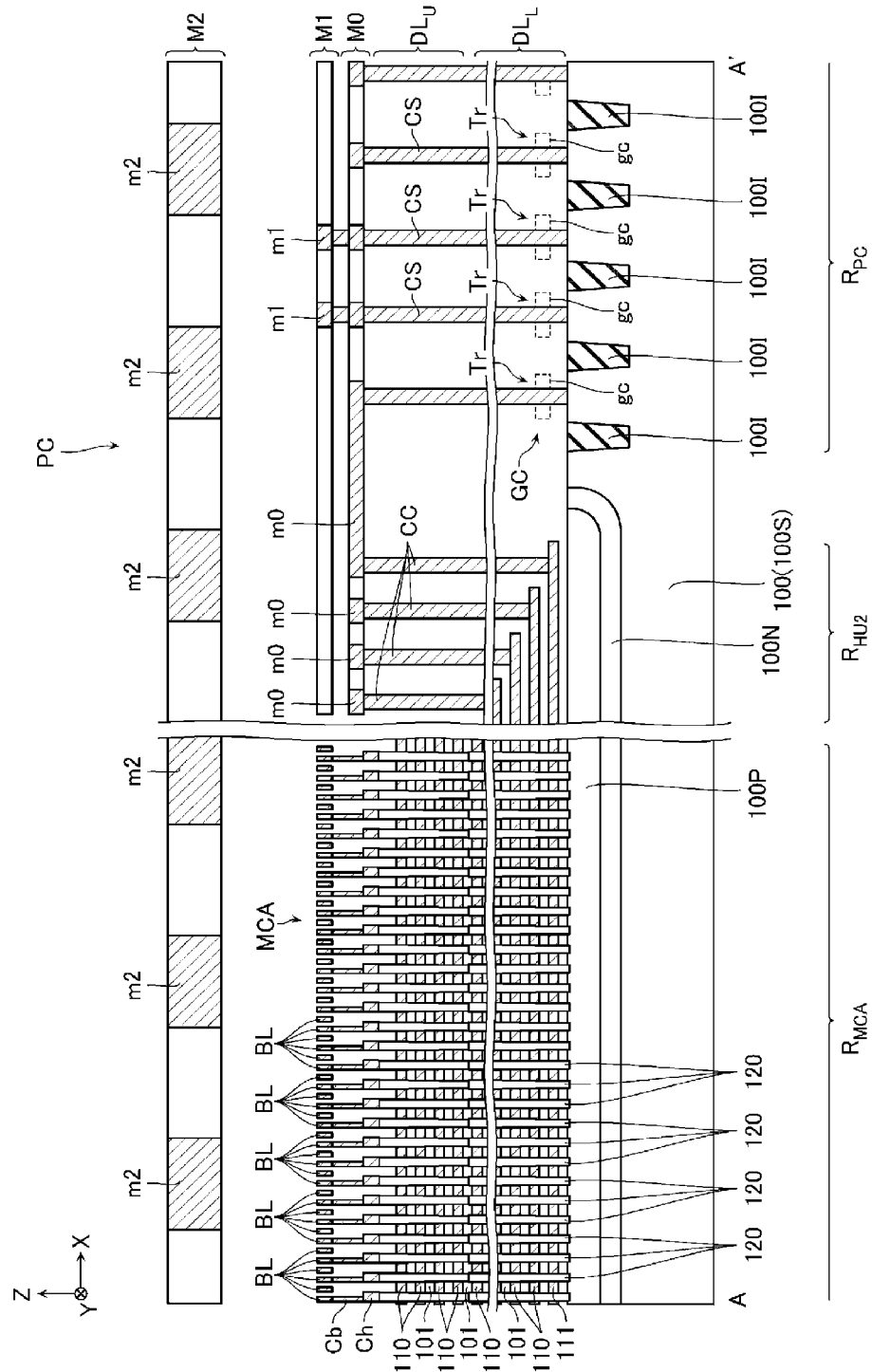
FIG. 7 illustrates a schematic cross-sectional view of a structure illustrated in FIG. 6, which is taken along a A-A' line and viewed in the arrow direction.
Figure 8:
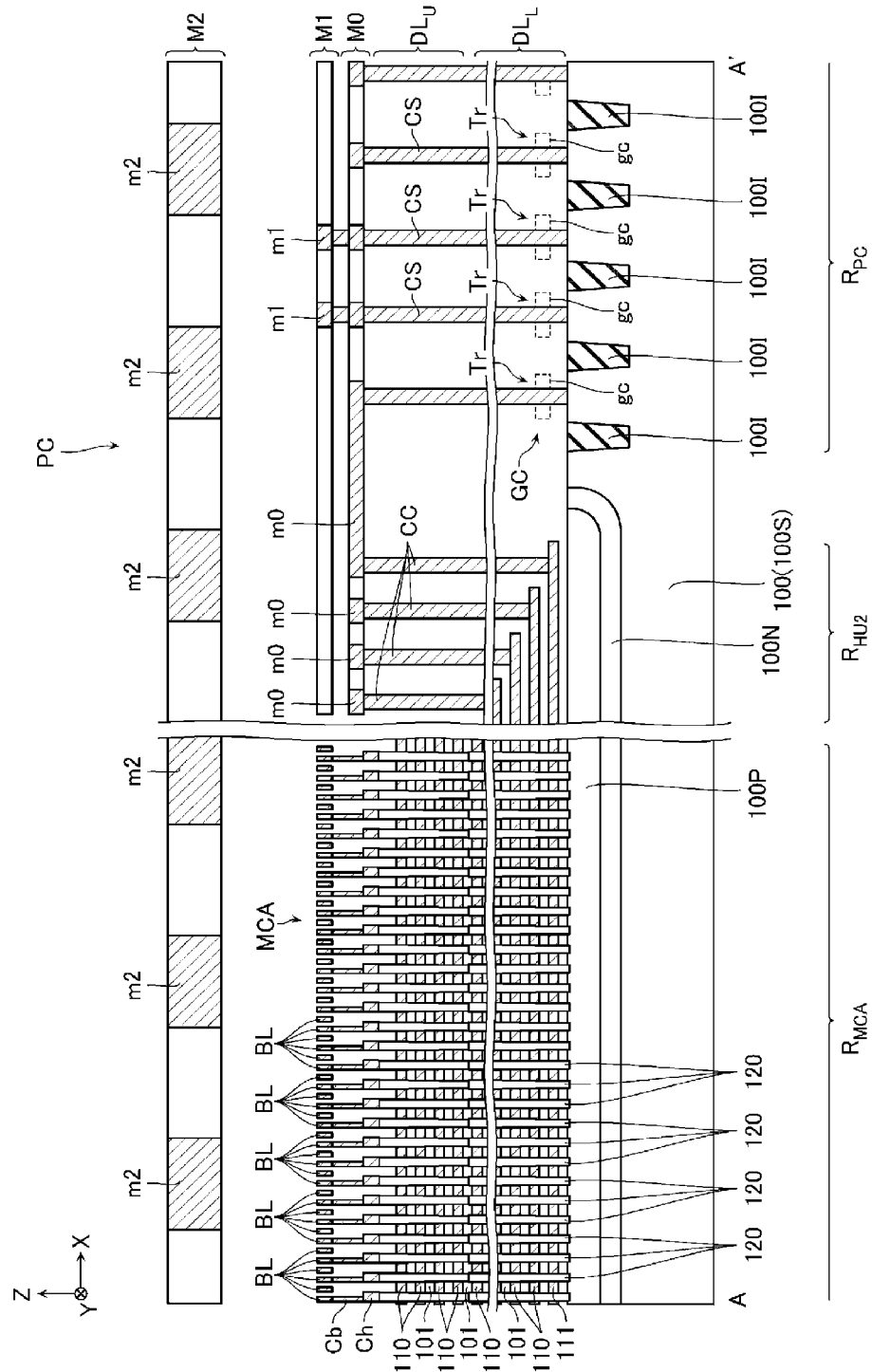
FIG. 8 illustrates an enlarged schematic view of a portion indicated by B in FIG. 6.
Figure 9:
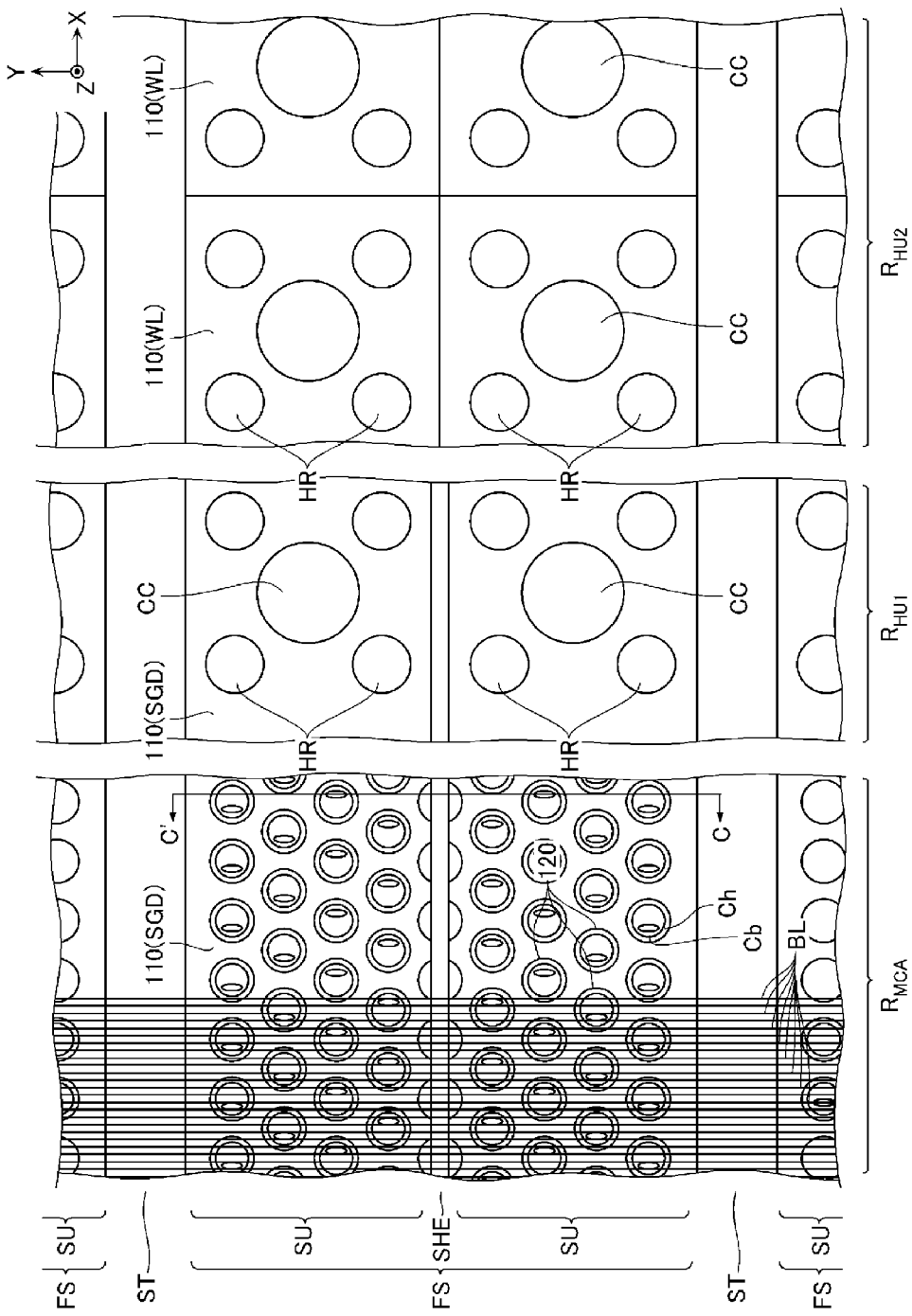
FIG. 9 illustrates an enlarged schematic view of each region illustrated in FIG. 8.
Figure 10:
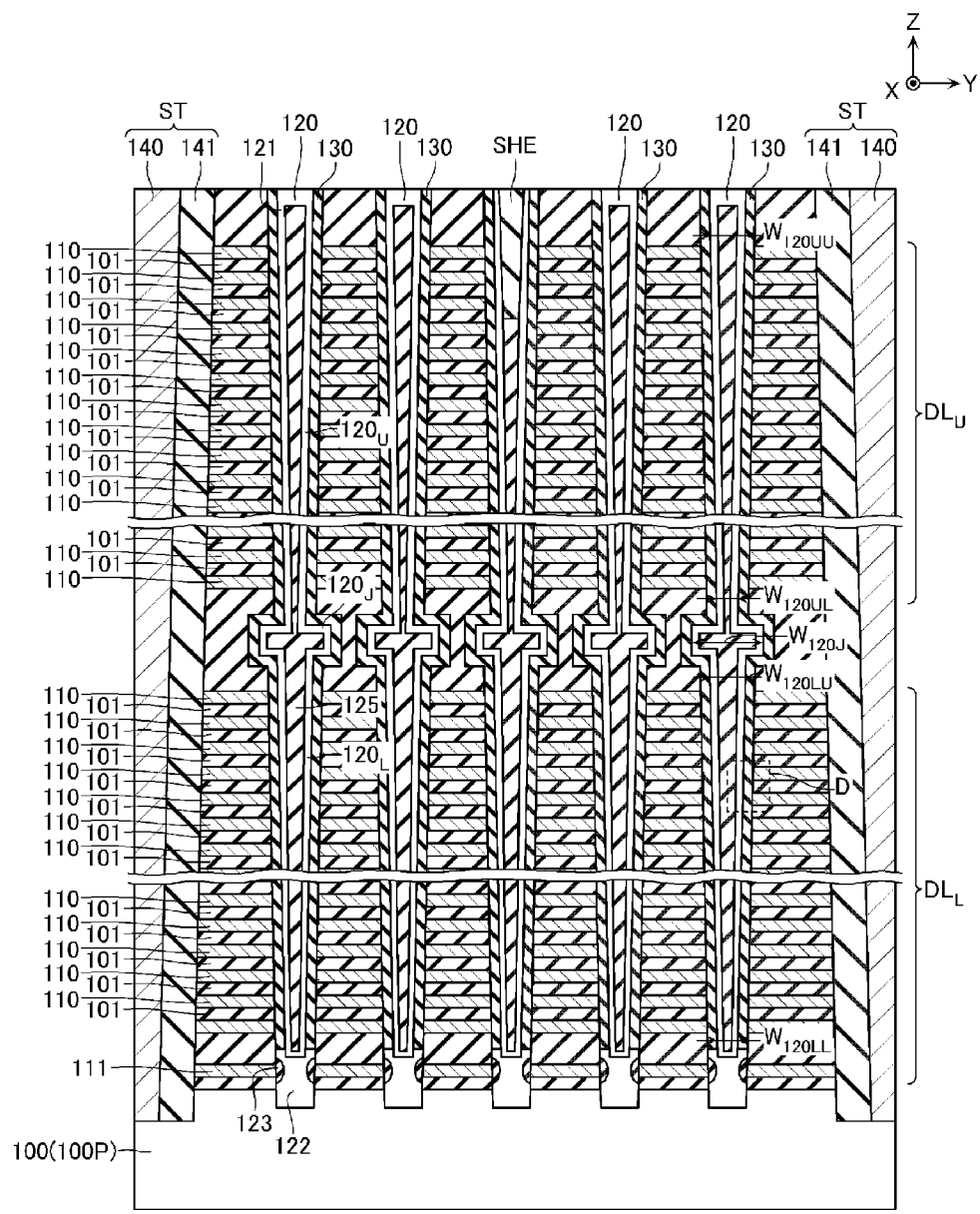
FIG. 10 illustrates a schematic cross-sectional view of a structure illustrated in FIG. 9, which is taken along a C-C' line and viewed in the arrow direction.
Figure 11:
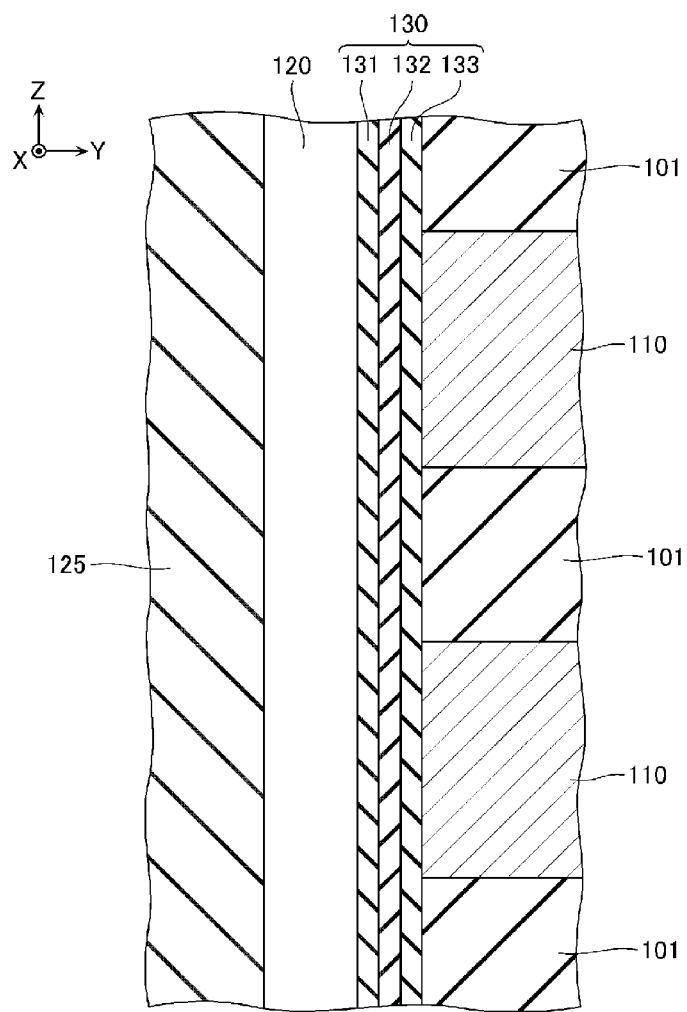
FIG. 11 illustrates an enlarged schematic view of a portion indicated by D in FIG. 10.
Figure 12:
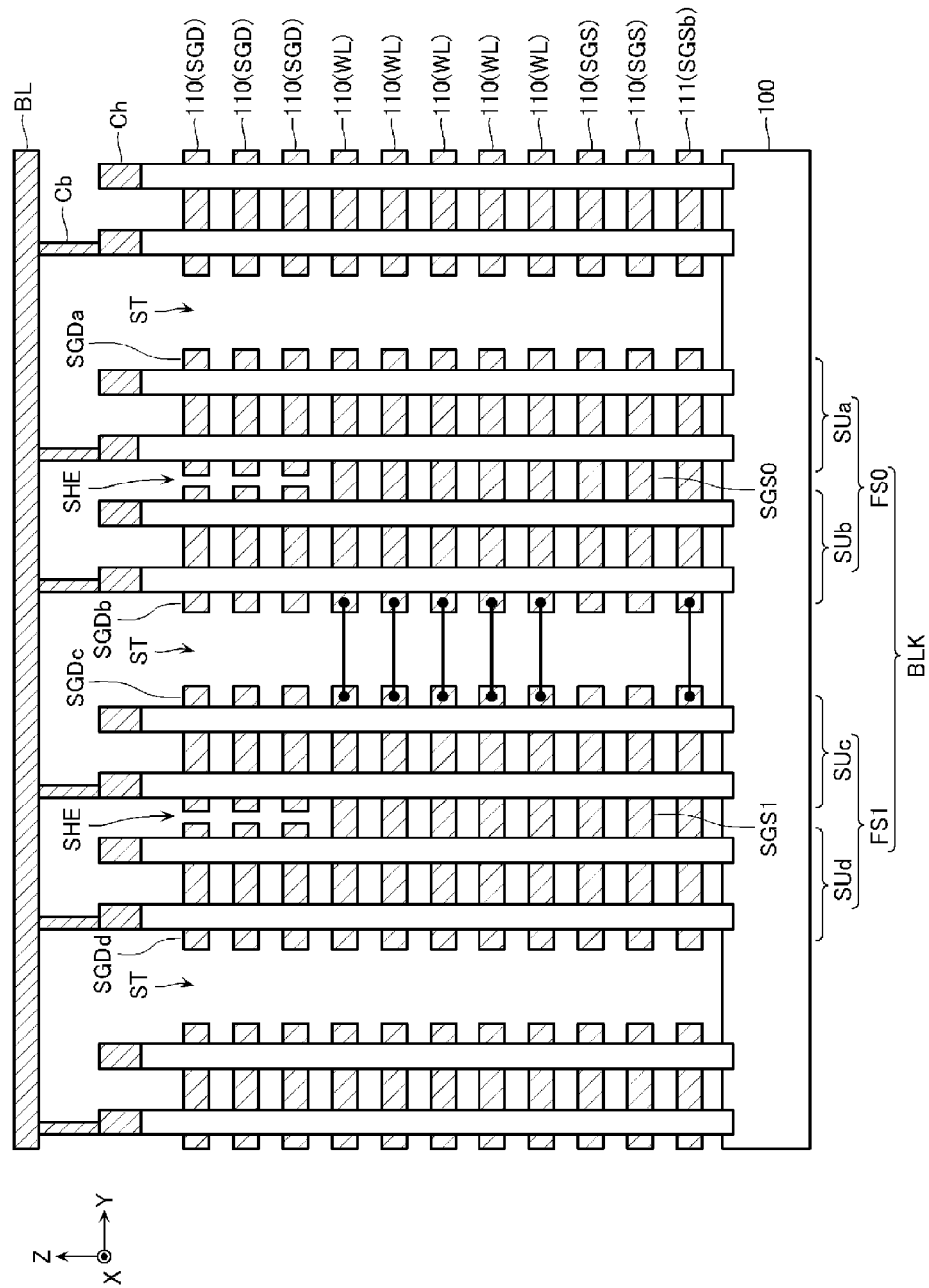
FIG. 12 illustrates a schematic cross-sectional view of a memory die.

FIG. 6 illustrates a schematic plan view of the memory die MD. FIG. 7 illustrates a schematic cross-sectional view of the structure illustrated in FIG. 6, which is taken along the A-A' line and seen in the arrow direction. FIG. 8 illustrates a schematic view of a portion indicated by B in FIG. 6, in an enlarged scale. FIG. 9 illustrates a schematic view of each region illustrated in FIG. 8, in an enlarged scale. FIG. 10 illustrates a schematic cross-sectional view of the structure illustrated in FIG. 9, which is taken along the C-C' line and seen in the arrow direction. FIG. 11 illustrates a schematic view of a portion indicated by D in FIG. 10, in an enlarged scale. FIG. 12 illustrates a schematic cross-sectional view of the memory die MD.

As illustrated in FIG. 6, the memory die MD includes a semiconductor substrate 100. In the illustrated example, the semiconductor substrate 100 includes two memory cell array regions $R_{MCA}$ arranged in the X direction. A first hook-up region $R_{HU1}$, and a second hook-up region $R_{HU2}$ farther from the memory cell array region $R_{MCA}$ than the first hook-up region $R_{HU1}$ are provided at positions aligned with the memory cell array region $R_{MCA}$ in the X direction. These regions extend in the Y direction along the end portions of the memory cell array region $R_{MCA}$ in the X direction. A peripheral circuit region $R_{PC}$ is provided outside these regions.

As illustrated in FIG. 7, the memory die MD includes a device layer $DL_L$ provided on the semiconductor substrate 100, a device layer $DL_U$ provided above the device layer $DL_L$, a wiring layer M0 provided above the device layer $DL_U$, a wiring layer M1 provided above the wiring layer M0, and a wiring layer M2 provided above the wiring layer M1.

[Structure of Semiconductor Substrate 100]

The semiconductor substrate 100 is a semiconductor substrate made of, for example, P-type silicon (Si), which contains a P-type impurity such as boron (B). For example, as illustrated in FIG. 7, on the surface of the semiconductor substrate 100, for example, an N-type well region 100N containing an N-type impurity such as phosphorous (P), a P-type well region 100P containing a P-type impurity such as boron (B), a semiconductor substrate region 100S where the N-type well region 100N and the P-type well region 100P are not provided, and an insulating region 100I are provided. Each of the N-type well region 100N, the P-type well region 100P, and the semiconductor substrate region 100S functions as a part of a plurality of transistors Tr, and a plurality of capacitors which make up the peripheral circuit PC.

[Structure of Device Layers $DL_L$ and $DL_U$ in Memory Cell Array Region $R_{MCA}$]

For example, as illustrated in FIG. 6, memory blocks BLK arranged in the Y direction are provided in the memory cell array region $R_{MCA}$. For example, as illustrated in FIG. 8, the memory block BLK includes two finger structures FS arranged in the Y direction. An inter-finger structure ST is provided between the two finger structures FS adjacent to each other in the Y direction.

In the following descriptions, two finger structures FS in a memory block BLK may be referred to as finger structures FS0 and FS1, respectively. Source-side select gate lines SGS corresponding to the finger structures FS0 and FS1 may be referred to as source-side select gate lines SGS0 and SGS1, respectively. Two string units SU in the finger structure FS0 may be referred to as string units SUa and SUb, respectively.

Two string units SU in the finger structure FS1 may be referred to as string units SUc and SUd, respectively. Drain-side select gate lines SGD corresponding to the string units SUa, SUb, SUc, and SUd may be referred to as drain-side select gate lines SGDa, SGDb, SGDc, and SGDd, respectively.

For example, as illustrated in FIG. 10, the finger structure FS includes a plurality of conductive layers 110 arranged in the Z direction, a plurality of semiconductor layers 120 extending in the Z direction, and a plurality of gate insulating films 130 provided between the plurality of conductive layers 110 and the plurality of semiconductor layers 120.

The conductive layer 110 is a substantially plate-shaped conductive layer that extends in the X direction. The conductive layer 110 may include a stacked film of a barrier conductive film of titanium nitride (TiN) and a metal film of tungsten (W). The conductive layer 110 may contain, for example, polycrystalline silicon containing an impurity such as phosphorous (P) or boron (B). Insulating layers 101 of silicon oxide ($SiO_2$) are provided between the conductive layers 110 arranged in the Z direction.

A conductive layer 111 is provided below the conductive layers 110. The conductive layer 111 may include, for example, a stack of a barrier conductive film of titanium nitride (TiN) and a metal film of tungsten (W). An insulating layer 101 of silicon oxide ($SiO_2$) is provided between the conductive layer 111 and the conductive layer 110.

For example, as illustrated in FIG. 12, the conductive layer 111 functions as a source-side select gate line SGSb (FIG. 5) and gate electrodes of a plurality of source-side select transistors STSb connected thereto. The conductive layer 111 is electrically independent for each memory block BLK.

Among the conductive layers 110, one or more conductive layers 110 located in the lowermost layer function as a source-side select gate line SGS (FIG. 5) and gate electrodes of a plurality of source-side select transistors STS connected thereto. These conductive layers 110 are electrically independent for each finger structure FS.

A plurality of conductive layers 110 located above these functions as word lines WL (FIG. 5) and gate electrodes of a plurality of memory cells MC (FIG. 5) connected thereto. The plurality of conductive layers 110 is electrically connected to a plurality of conductive layers 110 adjacent thereto in the X direction. These conductive layers 110 are electrically independent for each memory block BLK. The line connecting two word lines WL in FIG. 12 represents electrical (and may be also physical) connection.

One or more conductive layers 110 located above these function as a drain-side select gate line SGD and gate electrodes of a plurality of drain-side select transistors STD (FIG. 5) connected thereto. These conductive layers 110 have a smaller Y-direction width than other conductive layers 110. For example, as illustrated in FIGS. 9 and 12, an inter-string unit insulating layer SHE is provided between two conductive layers 110 adjacent to each other in the Y direction. These conductive layers 110 are electrically independent for each string unit SU.

For example, as illustrated in FIG. 9, the semiconductor layers 120 are arranged with a predetermined pattern in the X direction and the Y direction. The semiconductor layer 120 functions as a channel region of a plurality of memory cells MC and select transistors STD, STS, and STSb in one memory string MS (FIG. 5). The semiconductor layer 120 is, for example, a semiconductor layer of polycrystalline silicon (Si). For example, as illustrated in FIG. 10, the semiconductor layer 120 has a substantially bottomed-cylindrical shape, and an insulating layer 125 of silicon oxide is provided in the central portion.

The semiconductor layer 120 includes a semiconductor region $120_L$ ("second portion") in the device layer $DL_L$ and a semiconductor region $120_U$ ("first portion") in the device layer $DL_U$. The semiconductor layer 120 includes a semiconductor region $120_J$ ("connecting portion") connected to the upper end ("third end") of the semiconductor region $120_L$ and the lower end ("first end") of the semiconductor region $120_U$, a semiconductor region 122 connected to the lower end ("fourth end") of the semiconductor region $120_L$, and an impurity region 121 connected to the upper end ("second end") of the semiconductor region $120_U$.

The semiconductor region $120_L$ is a substantially cylindrical region that extends in the Z direction. The outer peripheral surface of the semiconductor region $120_L$ is surrounded by each of the conductive layers 110 in the device layer $DL_L$, and faces the conductive layers 110. The radial width $W_{120LL}$ ("fifth width") of the lower end portion of the semiconductor region $120_L$ (e.g., a portion located below the plurality of conductive layers 110 in the device layer $DL_L$) is smaller than the radial width $W_{120LU}$ ("fourth width") of the upper end portion of the semiconductor region $120_L$ (e.g., a portion located above the plurality of conductive layers 110 in the device layer $DL_L$).

The semiconductor region $120_U$ is a substantially cylindrical region that extends in the Z direction. The outer peripheral surface of the semiconductor region $120_U$ is surrounded by each of the conductive layers 110 in the device layer $DL_U$, and faces these conductive layers 110. The radial width $W_{120UL}$ ("first width") of the lower end portion of the semiconductor region $120_U$ (e.g., a portion located below the plurality of conductive layers 110 in the device layer $DL_U$) is smaller than the radial width $W120_{UU}$ ("second width") of the upper end portion of the semiconductor region $120_U$ (e.g., a portion located above the plurality of conductive layers 110 in the device layer $DL_U$) and the above width $W_{120LU}$.

Each semiconductor region $120_J$ is provided above the plurality of conductive layers 110 in the device layer $DL_L$, and is provided below the plurality of conductive layers 110 in the device layer $DL_U$. The radial width $W_{120J}$ ("third width") of the semiconductor region $120_J$ is larger than the above widths $W_{120LU}$ and $W_{120UU}$.

The semiconductor region 122 is connected to the P-type well region 100P of the semiconductor substrate 100. The semiconductor region 122 is made of, for example, single crystal silicon (Si). The semiconductor region 122 functions as a channel region of the source-side select transistor STSb. The outer peripheral surface of the semiconductor region 122 is surrounded by the conductive layer 111, and faces the conductive layer 111. An insulating layer 123 of silicon oxide is provided between the semiconductor region 122 and the conductive layer 111.

The impurity region 121 contains, for example, an N-type impurity such as phosphorous (P), and is connected to a bit line BL through a contact Ch and a contact Vy (FIG. 7).

The gate insulating film 130 has a substantially cylindrical shape that covers the outer peripheral surface of the semiconductor layer 120.

For example, as illustrated in FIG. 11, the gate insulating film 130 includes a tunnel insulating film 131, a charge storage film 132, and a block insulating film 133, which are stacked between the semiconductor layer 120 and the conductive layers 110. The tunnel insulating film 131 and the block insulating film 133 are, for example, insulating films of silicon oxide ($SiO_2$). The charge storage film 132 is, for example, a film of silicon nitride ($Si_3N_4$), which is capable of storing charges. The tunnel insulating film 131, the charge storage film 132, and the block insulating film 133 have substantially cylindrical shapes, and extend in the Z direction along the outer peripheral surface of the semiconductor layer 120.

FIG. 11 illustrates an example where the gate insulating film 130 includes the charge storage film 132 of silicon nitride. However, the gate insulating film 130 may include, for example, a floating gate of polycrystalline silicon containing an N-type or P-type impurity.

For example, as illustrated in FIG. 10, the inter-finger structure ST includes a conductive layer 140 extending in the Z direction and the X direction, and an insulating layer 141 provided on the side surface of the conductive layer 140. The conductive layer 140 is connected to an N-type impurity region provided in the P-type well region 100P of the semiconductor substrate 100. The conductive layer 140 may include, for example, a stacked film of a barrier conductive film of titanium nitride (TiN) and a metal film of tungsten (W). The conductive layer 140 functions as, for example, a part of a source line SL (FIG. 5).

[Structure of Device Layers $DL_L$ and $DL_U$ in First Hook-Up Region $R_{HU1}$]

As illustrated in FIG. 8, in the first hook-up region $R_{HU1}$, end portions of the conductive layers 110 in the X direction, which function as drain-side select gate lines SGD, are provided. In the first hook-up region $R_{HU1}$, contacts CC arranged in a matrix shape in the X direction and the Y direction are provided. As illustrated in FIG. 7, these contacts CC extend in the Z direction, and are connected to the conductive layers 110 at lower ends thereof. The contact CC may include, for example, a stacked film of a barrier conductive film of titanium nitride (TiN) and a metal film of tungsten (W).

As illustrated in FIG. 9, support structures HR are provided in the vicinity of the contact CC in the first hook-up region $R_{HU1}$. For example, similarly to the configuration described with reference to FIG. 10, the support structures HR include semiconductor layers 120 extending in the Z direction, and a plurality of gate insulating films 130 provided between the plurality of conductive layers 110 and the plurality of semiconductor layers 120. The semiconductor layer 120 in the support structure HR is insulated from the semiconductor substrate 100. The semiconductor layer 120 in the support structure HR is not connected to any wiring or the like.

[Structure of Device Layers $DL_L$ and $DL_U$ in Second Hook-Up Region $R_{HU2}$]

As illustrated in FIG. 8, in the second hook-up region $R_{HU2}$, a part of the conductive layers 110, which functions as word lines WL or source-side select gate lines SGS, is provided. In the second hook-up region $R_{HU2}$, contacts CC arranged in a matrix shape in the X direction and the Y direction are provided. As illustrated in FIG. 7, these contacts CC extend in the Z direction, and are connected to the conductive layers 110 at lower ends thereof.

As illustrated in FIG. 9, support structures HR are provided in the vicinity of the contact CC in the second hook-up region $R_{HU2}$.

[Structure of Device Layer DL in Peripheral Circuit Region $R_{PC}$]

For example, as illustrated in FIG. 7, in the peripheral circuit region $R_{PC}$ of the semiconductor substrate 100, a wiring layer GC is provided via an insulating layer (not illustrated). The wiring layer GC includes a plurality of electrodes gc that faces the surface of the semiconductor substrate 100. Regions of the semiconductor substrate 100 and the electrodes gc in the wiring layer GC are connected to contacts CS, respectively.

Each of the N-type well region 100N, the P-type well region 100P, and the semiconductor substrate region 100S of the semiconductor substrate 100 functions as a channel region of the plurality of transistors Tr that makes up the peripheral circuit PC, one electrode of the plurality of capacitors, or the like.

Each of the electrodes gc in the wiring layer GC functions as a gate electrode of the plurality of transistors Tr that makes up the peripheral circuit PC, the other electrode of the plurality of capacitors, or the like.

The contact CS extends in the Z direction, and is connected to the upper surface of the semiconductor substrate 100 or the electrode gc at the lower end thereof. An impurity region containing an N-type impurity or a P-type impurity is provided in the connection portion between the contact CS and the semiconductor substrate 100. The contact CC may include, for example, a stacked film of a barrier conductive film of titanium nitride (TiN) and a metal film of tungsten (W).

[Structure of Wiring Layers M0, M1, and M2]

For example, as illustrated in FIG. 7, a plurality of wirings in the wiring layers M0, M1, and M2 is electrically connected to, for example, at least one of the configuration in the memory cell array MCA and the configuration in the peripheral circuit PC, via the above described contacts CC and CS.

Each wiring layer M0 includes a plurality of wirings m0. These wirings m0 may include, for example, a stacked film of a barrier conductive film of titanium nitride (TiN) and a metal film of tungsten (W).

Each wiring layer M1 includes a plurality of wirings m1. These wirings m1 may include, for example, a stacked film of a barrier conductive film of titanium nitride (TiN) and a metal film of copper (Cu). A part of the plurality of wirings m1 functions as bit lines BL (FIG. 5). For example, as illustrated in FIG. 9, the bit lines BL are arranged in the X direction and extend in the Y direction. Each of the bit lines BL is connected to one semiconductor layer 120 in each string unit SU.

For example, as illustrated in FIG. 7, each wiring layer M2 includes a plurality of wirings m2. These wirings m2 may include, for example, a stacked film of a barrier conductive film of titanium nitride (TiN) and a metal film of aluminum (Al). A part of the plurality of wirings m2 functions as the pad electrodes P (FIGS. 2 and 3).

[Threshold Voltage of Memory Cell MC]

Next, descriptions will be made on a threshold voltage of a memory cell MC with reference to FIG. 13.

As described above, the memory cell array MCA includes a plurality of memory cells MC. When a write sequence is performed on the memory cells MC, threshold voltages of these memory cells MC are controlled by a plurality of states.

Figure 13:
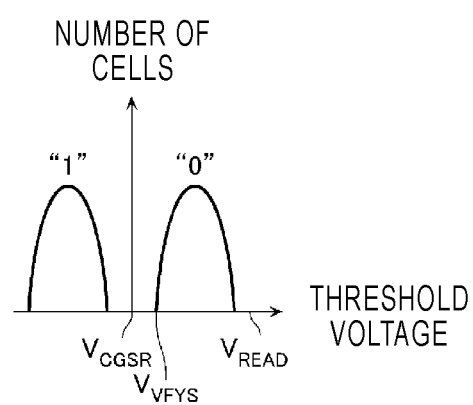
FIG. 13 is a schematic diagram illustrating aspects related to a threshold voltage of a memory cell.

FIG. 13 is a schematic histogram illustrating a threshold voltage of a memory cell MC where 1-bit data is recorded. The horizontal axis indicates a voltage of a word line WL, and the vertical axis indicates the number of memory cells MC.

In the example of FIG. 13, the threshold voltage of the memory cell MC is controlled in accordance with two types of states. For example, the threshold voltage of the memory cell MC in a lower state is lower than a read voltage $V_{CGSR}$ and a verification voltage $V_{VFYS}$ in FIG. 13. The threshold voltage of the memory cell MC in an upper state is larger than a read voltage $V_{CGSR}$ and a verification voltage $V_{VFYS}$ in FIG. 13, and is smaller than a read pass voltage $V_{READ}$.

For example, the lower state corresponds to a low threshold voltage (a threshold voltage of the memory cell MC in an erased state). For example, data "1" is assigned to the memory cell MC in the lower state.

The upper state corresponds to a high threshold voltage (a threshold voltage of the memory cell MC in a written state). For example, data "0" is assigned to the memory cell MC in the upper state.

[Read Operation]

Figure 14:
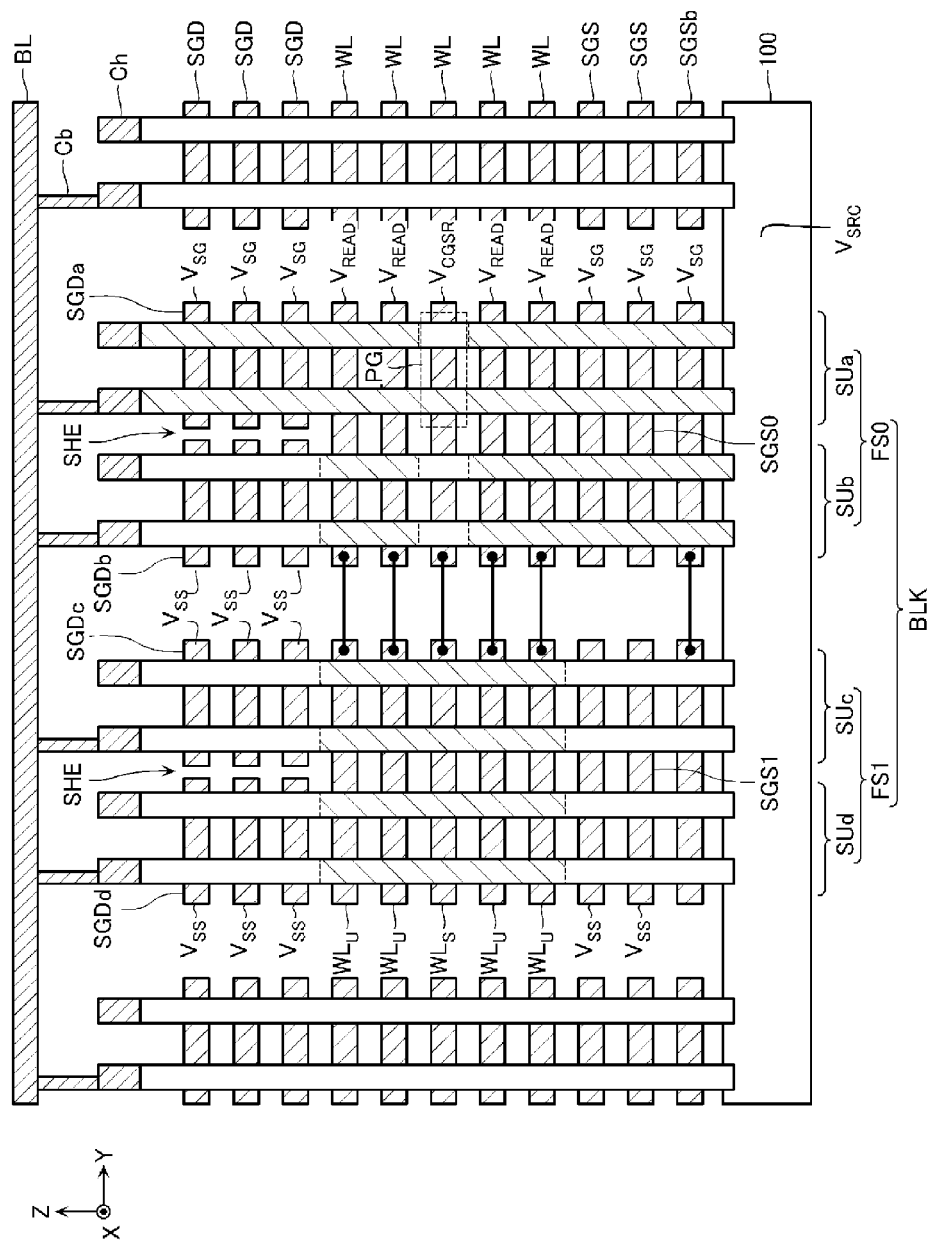
FIG. 14 is a schematic cross-sectional diagram depicting aspects related to a read operation.

Next, descriptions will be made on a read operation of the semiconductor storage device according to the present embodiment with reference to FIGS. 13 and 14. FIG. 14 illustrates a schematic cross-sectional diagram to explain a read operation.

In the following descriptions, a word line WL which is an operation target may be referred to as a selected word line $WL_S$, and the other word lines WL may be referred to as non-selected word lines $WL_U$. FIG. 14 illustrates an example where a read operation is executed on the memory cells MC connected to the selected word line $WL_S$ (hereinafter, may be referred to as "selected memory cells MC") among the memory cells MC in the string unit SUa. In the following descriptions, a configuration including the selected memory cells MC may be referred to as a selected page PG.

During the reading, for example, a voltage $V_{DD}$ is supplied to bit lines BL, and a voltage $V_{SRC}$ is supplied to a source line SL (FIG. 5). The voltage $V_{SRC}$ has, for example, a magnitude similar to a ground voltage $V_{SS}$. For example, the voltage $V_{SRC}$ is larger than the ground voltage $V_{SS}$, and is smaller than the voltage $V_{DD}$.

For example, as illustrated in FIG. 14, the plurality of selected memory cells MC in the selected page PG is electrically connected to the bit lines BL and the source line SL in a selective manner. For example, a voltage $V_{SG}$ is supplied to select gate lines SGDa, SGS0, and SGSb corresponding to the selected page PG so that the select transistors STD, STS, and STSb are turned ON. The ground voltage $V_{SS}$ is supplied to the other select gate lines SGDb, SGDc, SGDd, and SGS1 so that the select transistors STD and STS are turned OFF. Further, a read pass voltage $V_{READ}$ is supplied to the non-selected word lines $WL_U$ so that all memory cells MC connected to the non-selected word lines $WL_U$ are turned ON.

As illustrated in FIG. 14, a read voltage $V_{CGSR}$ is supplied to the selected word line $WL_S$. Accordingly, a memory cell MC corresponding to the lower state of FIG. 13 is turned ON, and a memory cell MC corresponding to the upper state is turned OFF.

The sense amplifier module SAM (FIG. 4) detects the ON state/OFF state of the selected memory cells MC.

Then, data detected by the sense amplifier module SAM is output. For example, the data detected by the sense amplifier module SAM is transferred to the control die CD (FIG. 1) through the cache memory CM (FIG. 4), the bus DB, and the input/output control circuit I/O. The control die CD performs bit error detection/correction or the like on this data, and then, transfers the data to the host computer 20.

[Program Operation]

Figure 15:
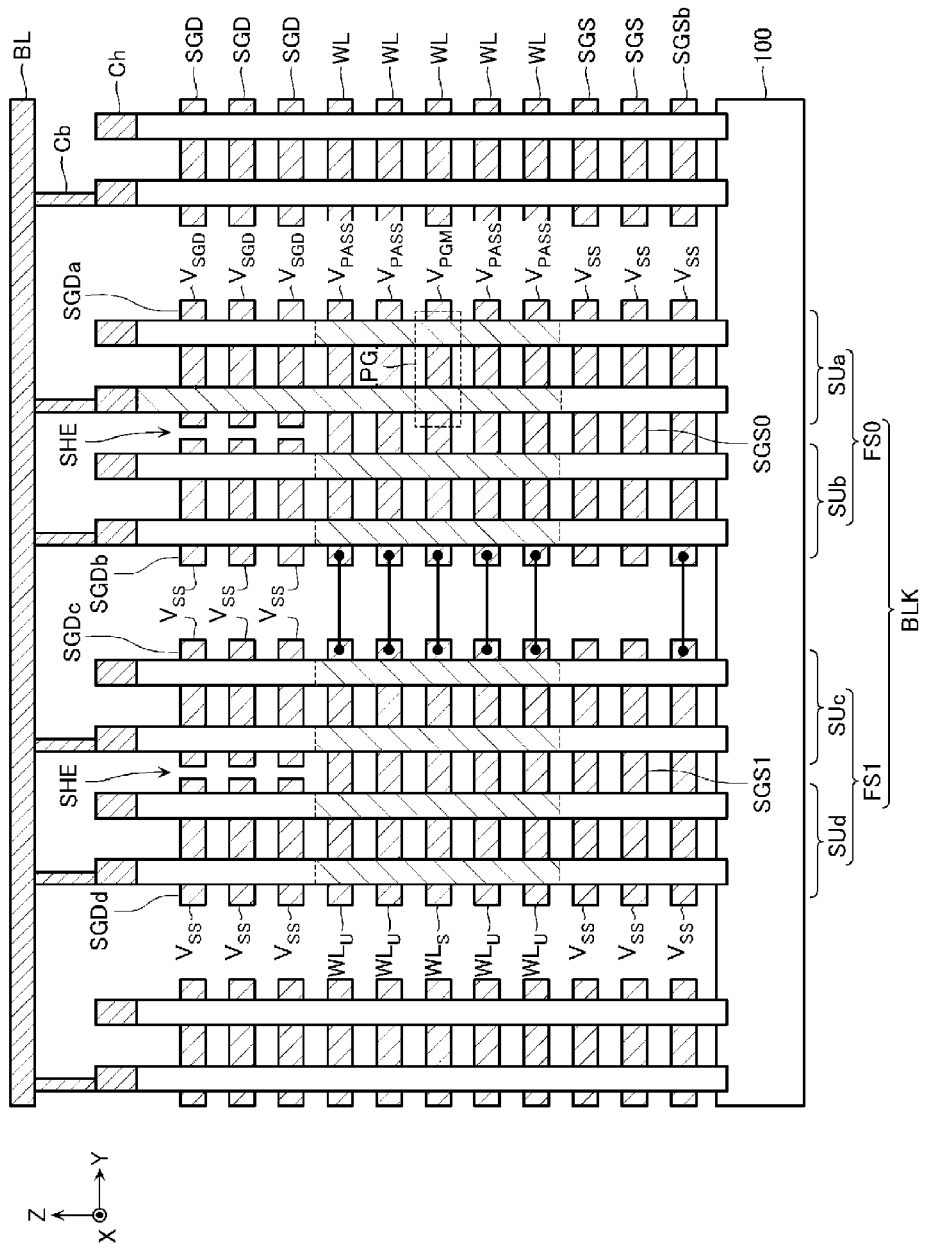
FIG. 15 is a schematic cross-sectional diagram depicting aspects related to a program operation.

Next, descriptions will be made on a program operation of the semiconductor storage device with reference to FIG. 15. FIG. 15 is a schematic cross-sectional diagram to explain a program operation.

FIG. 15 illustrates an example where a program operation is executed on selected memory cells MC which are in the string unit SUa and connected to the selected word line $WL_S$.

During the program operation, for example, a voltage $V_{SRC}$ is supplied to a bit line BL connected to a memory cell MC subjected to adjustment of a threshold voltage (hereinafter, may be referred to as a "write memory cell MC") among the plurality of selected memory cells MC, and a voltage $V_{DD}$ is supplied to a bit line BL connected to a memory cell MC not subjected to the adjustment of the threshold voltage (hereinafter, may be referred to as a "protected memory cell MC") among the plurality of selected memory cells MC.

As illustrated in FIG. 15, the memory cell MC subjected to adjustment of the threshold voltage is electrically connected to the bit line BL in a selective manner. For example, a voltage $V_{SGD}$ is supplied to a drain-side select gate line SGDa corresponding to the selected page PG, and a ground voltage $V_{SS}$ is supplied to the other drain-side select gate lines SGDb, SGDc, and SGDd. The voltage $V_{SGD}$ is smaller than, for example, the voltage $V_{SG}$ in FIG. 14. Accordingly, a drain-side select transistor STD corresponding to the bit line BL to which the voltage $V_{SRC}$ is supplied is turned ON, and a drain-side select transistor STD corresponding to the bit line BL to which the voltage $V_{DD}$ is supplied is turned OFF. A write pass voltage $V_{PASS}$ is supplied to the non-selected word line $WL_U$ corresponding to the non-selected page. The write pass voltage $V_{PASS}$ is larger than, for example, the read pass voltage $V_{READ}$ in FIG. 14.

As illustrated in FIG. 15, a program voltage $V_{PGM}$ is supplied to the selected word line $WL_S$. The program voltage $V_{PGM}$ is larger than the write pass voltage $V_{PASS}$. Accordingly, electrons are stored in the charge storage film 132 (FIG. 11) of a desired memory cell MC, and the threshold voltage of the memory cell MC is increased.

[Verification Operation]

Figure 16:
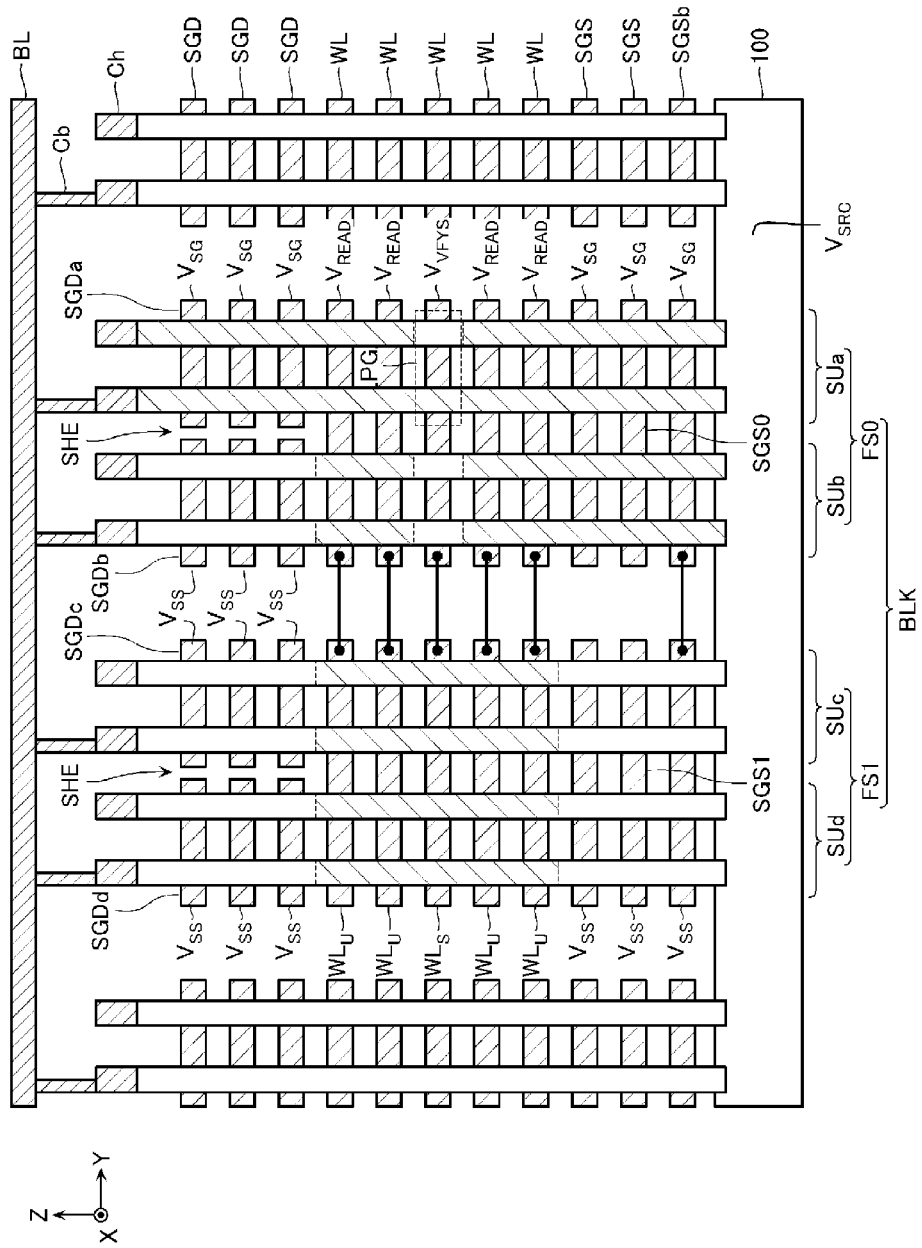
FIG. 16 is a schematic cross-sectional diagram depicting aspects related to a verification operation.

Next, descriptions will be made on a verification operation of the semiconductor storage device with reference to FIG. 16. FIG. 16 is a schematic cross-sectional diagram to explain a verification operation.

FIG. 16 illustrates an example where a verification operation is executed on selected memory cells MC which are in the string unit SUa and connected to the selected word line $WL_S$.

During the verification operation, for example, a voltage $V_{DD}$ is supplied to bit lines BL, and a voltage $V_{SRC}$ is supplied to a source line SL (FIG. 5). The selected memory cells MC are electrically connected to the bit lines BL and the source line SL in a selective manner. A verification voltage $V_{VFYS}$ (FIG. 13) is supplied to the selected word line $WL_S$, and the ON state/OFF state of the selected memory cells MC are detected. Accordingly, it is determined whether the threshold voltage has reached a predetermined level.

After the verification operation is executed, the result of the verification operation is determined. For example, if the number of memory cells MC for which the threshold voltage has not reached a predetermined level is some predetermined number or more, a determination of verification FAIL is made. If the number of memory cells MC for which the threshold voltage has not reached a predetermined level is less than the predetermined number, a determination of verification PASS is made.

[Write Sequence]

Figure 17:
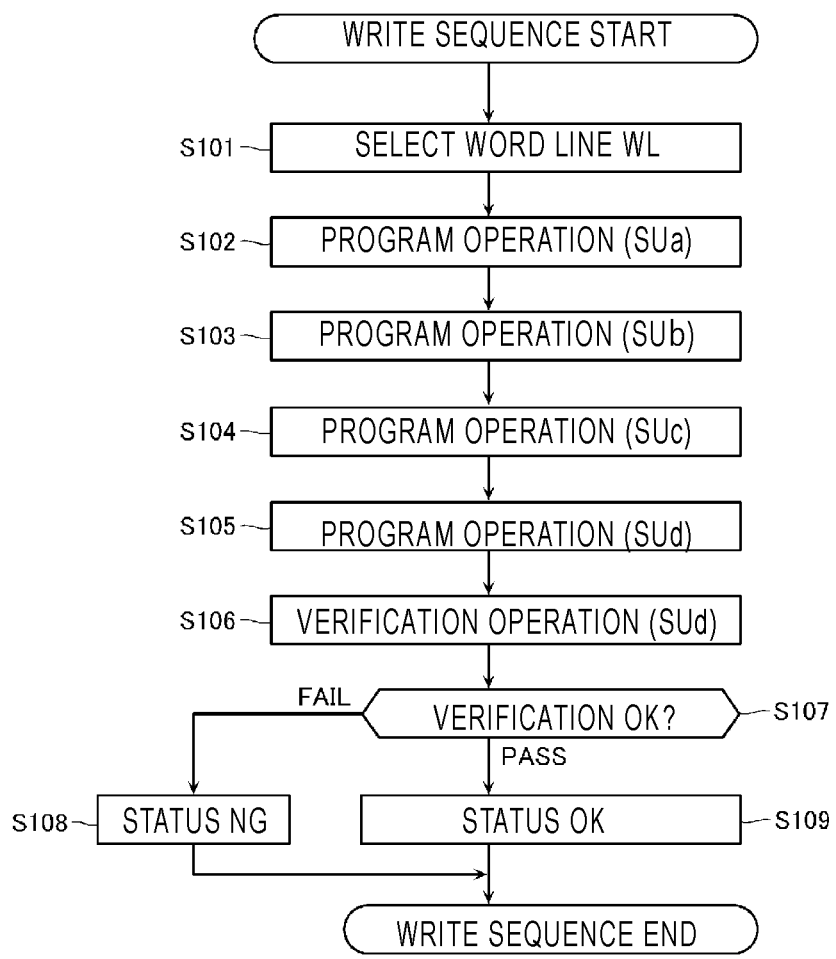
FIG. 17 is a flowchart illustrating a write sequence according to a first embodiment.
Figure 18:
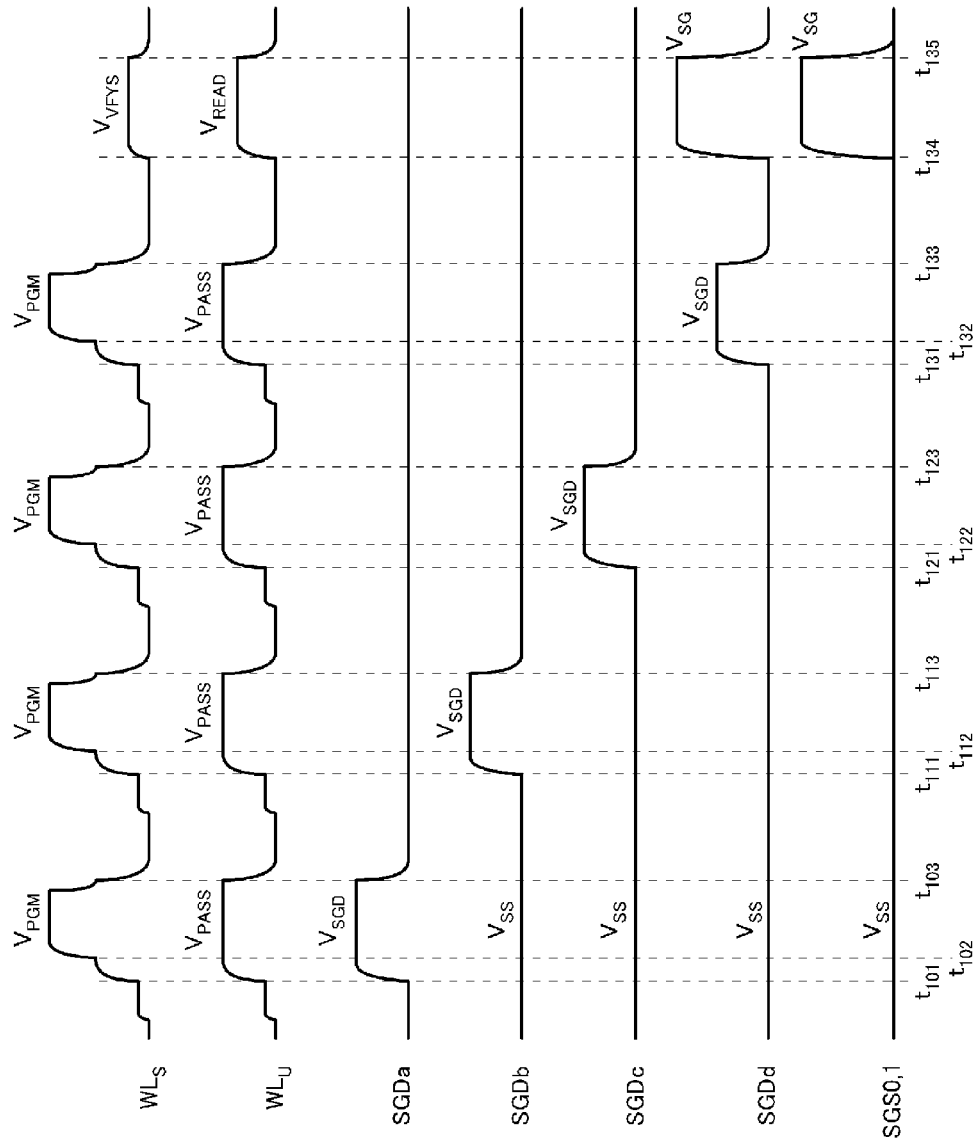
FIG. 18 is a schematic waveform diagram illustrating aspects of a write sequence according to a first embodiment.

FIG. 17 is a flowchart illustrating a write sequence according to the present embodiment. FIG. 18 is a waveform diagram illustrating a write sequence according to the present embodiment.

In step S101, among a plurality of word lines WL in a memory block BLK (FIG. 15), one word line WL is selected as a selected word line $WL_S$.

In step S102, the above-described program operation is executed on a page PG in a string unit SUa. Accordingly, for example, as illustrated in FIG. 18, at a timing $t_{101}$, a write pass voltage $V_{PASS}$ is supplied to the selected word line $WL_S$ and non-selected word lines $WL_U$. Further, a voltage $V_{SGD}$ is supplied to a drain-side select gate line SGDa. Further, a ground voltage $V_{SS}$ is supplied to drain-side select gate lines SGDb, SGDc, and SGDd. Further, a ground voltage $V_{SS}$ is supplied to source-side select gate lines SGS0 and SGS1. Subsequently, at a timing $t_{102}$, a program voltage $V_{PGM}$ is supplied to the selected word line $WL_S$. Subsequently, at a timing $t_{103}$, a ground voltage $V_{SS}$ is supplied to the selected word line $WL_S$, the non-selected word lines $WL_U$, the drain-side select gate lines SGDa, SGDb, SGDc, and SGDd, and the source-side select gate lines SGS0 and SGS1.

After the step S102 is ended, status data $D_{ST}$ indicating that the write sequence is normally ended may be stored in the status register STR (FIG. 4), and status data $D_{ST}$ indicating that a verification operation is not executed may be stored.

In step S103, for example, as illustrated in FIG. 17, the above-described program operation is executed on a page PG in a string unit SUb. Accordingly, for example, as illustrated in FIG. 18, at a timing $t_{111}$, a write pass voltage $V_{PASS}$ is supplied to the selected word line $WL_S$ and the non-selected word lines $WL_U$. Further, a voltage $V_{SGD}$ is supplied to the drain-side select gate line SGDb. Further, a ground voltage $V_{SS}$ is supplied to the drain-side select gate lines SGDa, SGDc, and SGDd. Further, a ground voltage $V_{SS}$ is supplied to the source-side select gate lines SGS0 and SGS1. Subsequently, at a timing $t_{112}$, a program voltage $V_{PGM}$ is supplied to the selected word line $WL_S$. Subsequently, at a timing $t_{113}$, a ground voltage $V_{SS}$ is supplied to the selected word line $WL_S$, the non-selected word lines $WL_U$, the drain-side select gate lines SGDa, SGDb, SGDc, and SGDd, and the source-side select gate lines SGS0 and SGS1.

After the step S103 is ended, status data $D_{ST}$ indicating that the write sequence is normally ended may be stored in the status register STR (FIG. 4), and status data $D_{ST}$ indicating that a verification operation is not executed may be stored.

In step S104, for example, as illustrated in FIG. 17, the above-described program operation is executed on a page PG in a string unit SUc. Accordingly, for example, as illustrated in FIG. 18, at a timing $t_{121}$, a write pass voltage $V_{PASS}$ is supplied to the selected word line $WL_S$ and the non-selected word lines $WL_U$. Further, a voltage $V_{SGD}$ is supplied to the drain-side select gate line SGDc. Further, a ground voltage $V_{SS}$ is supplied to the drain-side select gate lines SGDa, SGDb, and SGDd. Further, a ground voltage $V_{SS}$ is supplied to the source-side select gate lines SGS0 and SGS1. Subsequently, at a timing $t_{122}$, a program voltage $V_{PGM}$ is supplied to the selected word line $WL_S$. Subsequently, at a timing $t_{123}$, a ground voltage $V_{SS}$ is supplied to the selected word line $WL_S$, the non-selected word lines $WL_U$, the drain-side select gate lines SGDa, SGDb, SGDc, and SGDd, and the source-side select gate lines SGS0 and SGS1.

After the step S104 is ended, status data $D_{ST}$ indicating that the write sequence is normally ended may be stored in the status register STR (FIG. 4), and status data $D_{ST}$ indicating that a verification operation is not executed may be stored.

In step S105, for example, as illustrated in FIG. 17, the above-described program operation is executed on a page PG in a string unit SUd. Accordingly, for example, as illustrated in FIG. 18, at a timing $t_{131}$, a write pass voltage $V_{PASS}$ is supplied to the selected word line $WL_S$ and the non-selected word lines $WL_U$. Further, a voltage $V_{SGD}$ is supplied to the drain-side select gate line SGDd. Further, a ground voltage $V_{SS}$ is supplied to the drain-side select gate lines SGDa, SGDb, and SGDc. Further, a ground voltage $V_{SS}$ is supplied to the source-side select gate lines SGS0 and SGS1. Subsequently, at a timing $t_{132}$, a program voltage $V_{PGM}$ is supplied to the selected word line $WL_S$. Subsequently, at a timing $t_{133}$, a ground voltage $V_{SS}$ is supplied to the selected word line $WL_S$, the non-selected word lines $WL_U$, the drain-side select gate lines SGDa, SGDb, SGDc, and SGDd, and the source-side select gate lines SGS0 and SGS1.

In step S106, for example, as illustrated in FIG. 17, the above-described verification operation is executed on the page PG in the string unit SUd. Accordingly, for example, as illustrated in FIG. 18, at a timing $t_{134}$, a verification voltage $V_{VFYS}$ is supplied to the selected word line $WL_S$. Further, a read pass voltage $V_{READ}$ is supplied to the non-selected word lines $WL_U$. Further, a voltage $V_{SG}$ is supplied to the drain-side select gate line SGDd. Further, a ground voltage $V_{SS}$ is supplied to the drain-side select gate lines SGDa, SGDb, and SGDc. Further, a ground voltage $V_{SS}$ is supplied to the source-side select gate line SGS0. Further, a voltage $V_{SG}$ is supplied to the source-side select gate line SGS1. Subsequently, at a timing $t_{135}$, a ground voltage $V_{SS}$ is supplied to the selected word line $WL_S$, the non-selected word lines $WL_U$, the drain-side select gate lines SGDa, SGDb, SGDc, and SGDd, and the source-side select gate lines SGS0 and SGS1.

In step S107, for example, as illustrated in FIG. 17, the result of the verification operation is determined. For example, if the number of memory cells MC for which the threshold voltage has not reached a predetermined level is some predetermined number or more, a determination of verification FAIL is made, and the process proceeds to step S108. If the number of memory cells MC for which the threshold voltage has not reached the predetermined level is less than the predetermined number, a determination of verification PASS is made, and the process proceeds to step S109.

In step S108, status data $D_{ST}$ indicating that the write sequence is not normally ended is stored in the status register STR (FIG. 4), and is output to the control die CD (FIG. 1), and then, the write sequence is ended.

In step S109, status data $D_{ST}$ indicating that the write sequence is normally ended is stored in the status register STR (FIG. 4), and is output to the control die CD (FIG. 1), and then, the write sequence is ended.

[Effect of First Embodiment]

Figure 19:
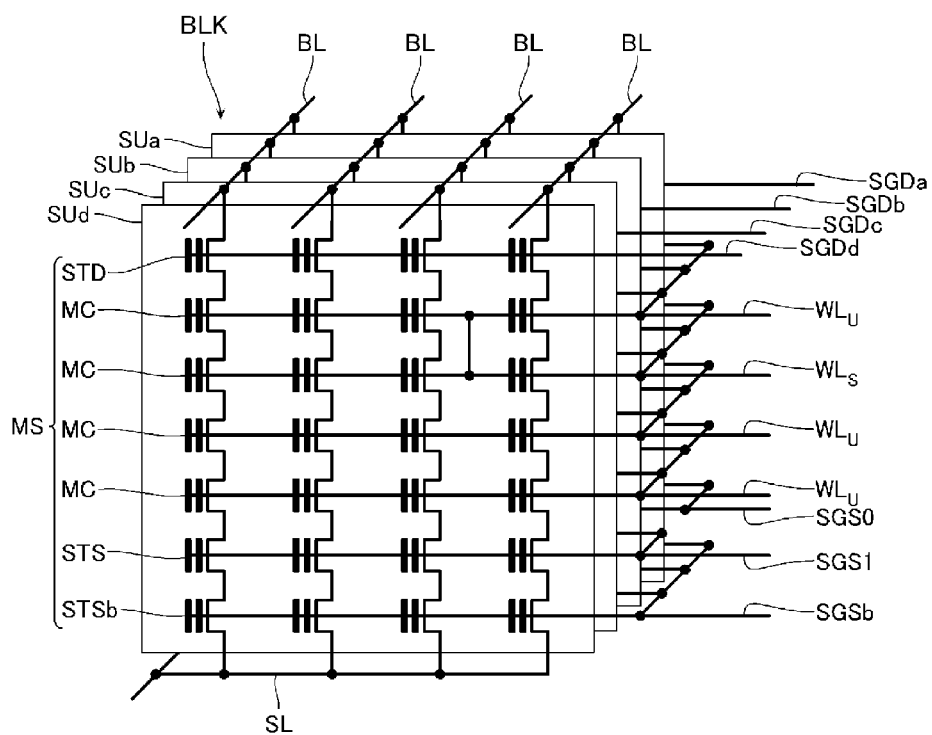
FIG. 19 is a schematic circuit diagram illustrating a leakage path between two word lines.
Figure 20:
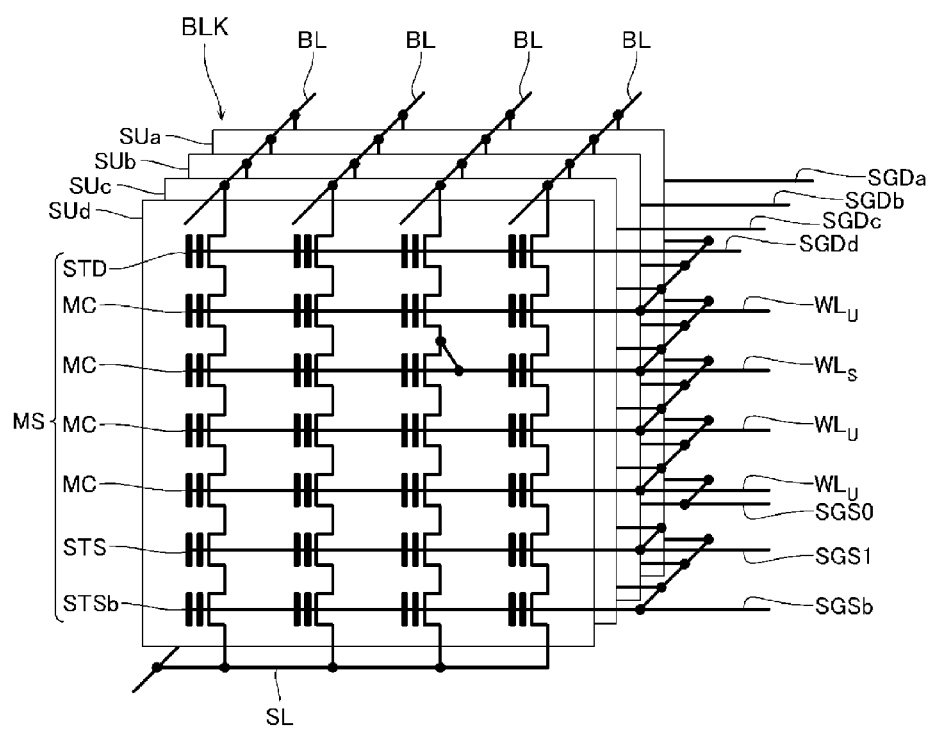
FIG. 20 is a schematic circuit diagram illustrating a leakage path between a word line and a semiconductor layer.

FIGS. 19 and 20 are schematic circuit diagrams illustrating the configuration of the memory block BLK according to the present embodiment.

FIG. 19 illustrates a state where dielectric breakdown or the like occurs between two word lines WL, which causes a leakage path. When a program operation is executed by using the word line WL in this state as the selected word line $WL_S$, in some cases, the selected word line $WL_S$ is not increased to a program voltage $V_{PGM}$, and electrons may not be properly stored in the charge storage film 132 (FIG. 11) of a desired memory cell MC. When the verification operation is executed in this state, there is a high possibility that determination of verification FAIL is made in step S107 of FIG. 17.

FIG. 20 illustrates a state where dielectric breakdown or the like occurs between a word line WL and a semiconductor layer 120 (FIG. 10), which causes a leakage path. When a program operation is executed by using the word line WL in this state as the selected word line $WL_S$, in some cases, the selected word line $WL_S$ is not increased to a program voltage $V_{PGM}$, and electrons may not be properly stored in the charge storage film 132 (FIG. 11) of a desired memory cell MC. When the verification operation is executed in this state, there is a high possibility that determination of verification FAIL is made in step S107 of FIG. 17.

Here, as described above, each word line WL is commonly connected to all string units SUa to SUd in one memory block BLK. Therefore, when the leakage path described with reference to FIG. 19 or 20 occurs in any of the string units SUa to SUd in the memory block BLK, even when the program operation and the verification operation are executed on other string units SUa to SUd, the phenomenon described above may occur.

Here, in the present embodiment, after the selected word line $WL_S$ is selected in step S101 of FIG. 17, the program operation is executed on all pages PG corresponding to the selected word line $WL_S$ (steps S102 to S105), and then, the verification operation is executed (step S106).

According to this method, for example, a time required for the write sequence may be largely reduced, as compared to that when the verification operation is executed each time the program operation is executed. For example, as compared to a case where the verification operation is not executed, it is possible to largely improve the reliability of the write sequence by detecting the occurrence of a leakage path between word lines WL, and a leakage path between a word line WL and a semiconductor layer 120 as described above. Therefore, according to the semiconductor storage device of the present embodiment, it is possible to implement a high-speed write sequence with a high reliability.

Second Embodiment

Next, a semiconductor storage device according to a second embodiment will be described. The semiconductor storage device according to the second embodiment is configured in much the same manner as the semiconductor storage device according to the first embodiment; however, the semiconductor storage device according to the second embodiment is different from the first embodiment in the execution order of the program operation and the verification operation.

Figure 21:
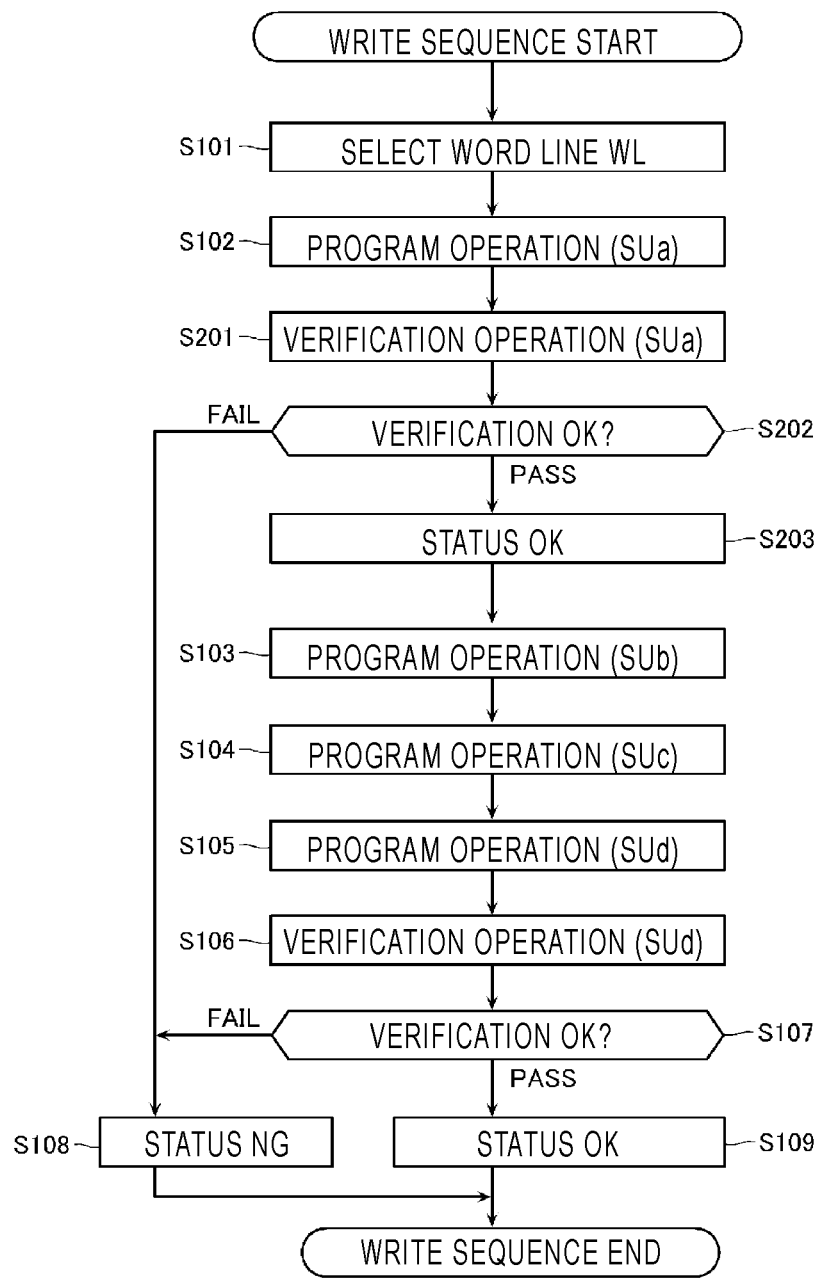
FIG. 21 is a flowchart illustrating a write sequence according to a second embodiment.
Figure 22:
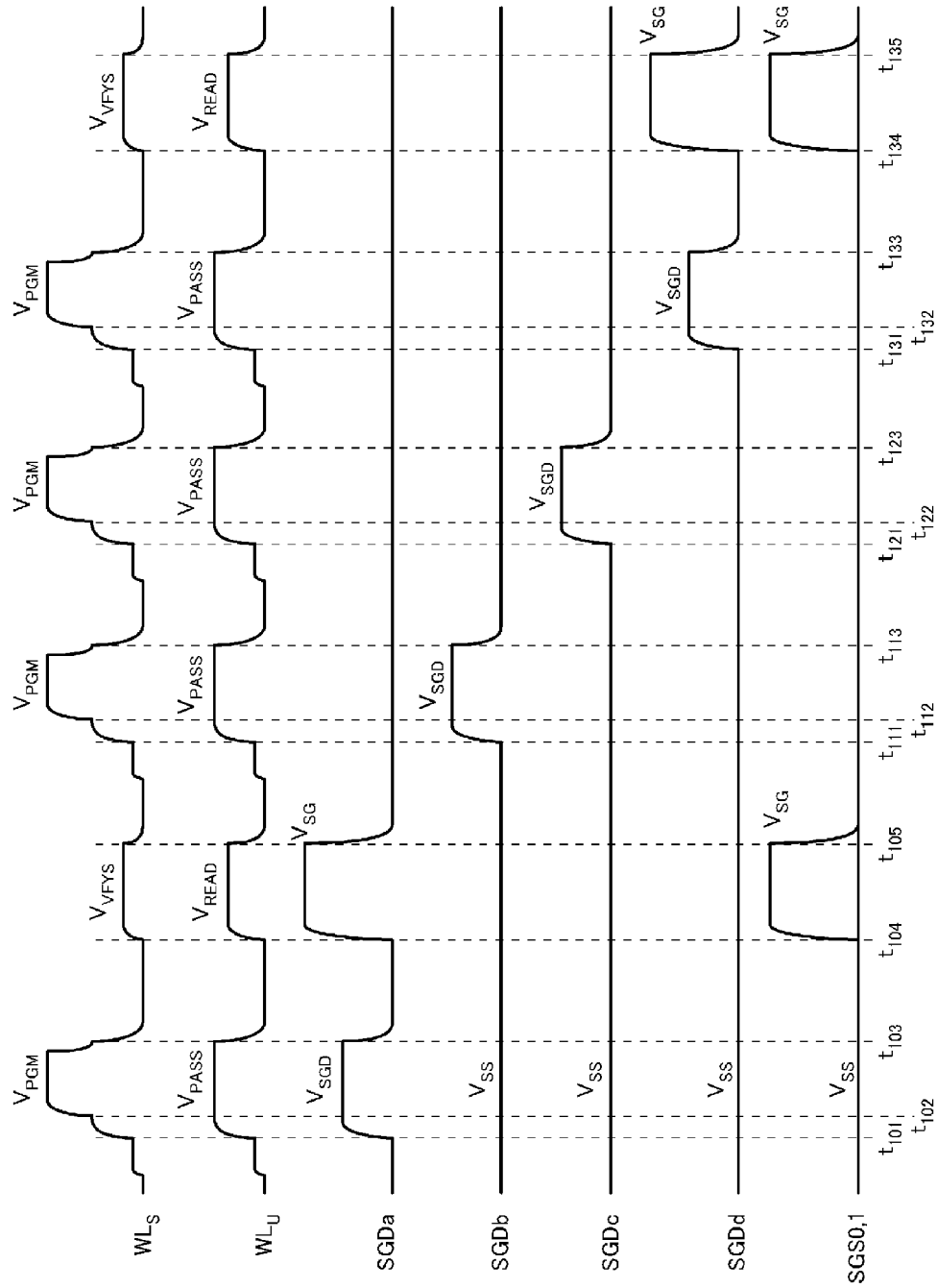
FIG. 22 is a schematic waveform diagram illustrating aspects of aa write sequence according to a second embodiment.

FIG. 21 is a flowchart illustrating a write sequence according to the second embodiment. FIG. 22 is a waveform diagram illustrating a write sequence according to the second embodiment.

As illustrated in FIG. 21, the write sequence according to the second embodiment is executed in much the same manner as the write sequence according to the first embodiment. However, in the second embodiment, step S201 is executed after step S102 is executed.

In step S201, as illustrated in FIG. 21, the above-described verification operation is executed on a page PG in a string unit SUa. Accordingly, as illustrated in FIG. 22, at a timing $t_{104}$, a verification voltage $V_{VFYS}$ is supplied to a selected word line $WL_S$. Furthermore, a read pass voltage $V_{READ}$ is supplied to non-selected word lines $WL_U$ and a voltage $V_{SG}$ is supplied to a drain-side select gate line SGDa.

A ground voltage $V_{SS}$ is supplied to drain-side select gate lines SGDb, SGDc, and SGDd, and a voltage $V_{SG}$ is supplied to a source-side select gate line SGS0. The ground voltage $V_{SS}$ is also supplied to a source-side select gate line SGS1. Subsequently, at a timing $t_{105}$, ground voltage $V_{SS}$ is supplied to the selected word line $WL_S$, the non-selected word lines $WL_U$, the drain-side select gate lines SGDa, SGDb, SGDc, and SGDd, and the source-side select gate lines SGS0, and SGS1.

In step S202, as illustrated in FIG. 21, the result of the verification operation is determined. For example, if the number of memory cells MC for which the threshold voltage has not reached a predetermined level is some predetermined number or more, a determination of verification FAIL is made, and the process proceeds to step S108. However, if the number of memory cells MC for which the threshold voltage has not reached the predetermined level is less than the predetermined number, a determination of verification PASS is made, and the process proceeds to step S203.

In step S203, status data $D_{ST}$ indicating that the write operation is normally ended is stored in the status register STR (FIG. 4), and is output to the control die CD (FIG. 1), and then the process proceeds to step S103.

[Effect of Second Embodiment]

According to the semiconductor storage device according to the present embodiment, as in the first embodiment, it is possible to write with high speed and high reliability.

In the present embodiment, the verification operation is executed not only after the program operation is executed on the last string unit SUd corresponding to the selected word line $WL_S$ but also after the program operation is executed on the first string unit SUa corresponding to the selected word line $WL_S$. According to this method, for example, it is possible to detect a leakage path or the like which occurs before the start of the write sequence, at an earlier stage than in the first embodiment.

Third Embodiment

Next, a semiconductor storage device according to a third embodiment will be described. The semiconductor storage device according to the third embodiment is configured in substantially the same manner as the semiconductor storage device according to the first embodiment or the second embodiment; however, in some cases, the third embodiment is different from that of the first embodiment or the second embodiment in the order of execution of a program operation and a verification operation.

In some cases, the leakage path described with reference to FIGS. 19 and 20 is likely to occur in certain word lines WL. In order to further increase the speed of the semiconductor storage device, for example, executing the write sequence according to the first embodiment or the second embodiment on these word lines WL, and executing a higher-speed write sequence on other word lines WL may be taken into consideration.

For example, in the semiconductor storage device described with reference to FIG. 10, the semiconductor layer 120 includes the semiconductor region $120_L$, and the semiconductor region $120_U$. In some cases, for example, the leakage path described with reference to FIGS. 19 and 20 is likely to occur near the lower end and the upper end of the semiconductor region $120_L$, and near the lower end and the upper end of the semiconductor region $120_U$.

In such a case, for example, when any of $n_{LA}$ ($n_{LA}$ is a natural number) conductive layers 110 counted from the bottom is selected as the selected word line $WL_S$ among the plurality of conductive layers 110 in the device layer $DL_L$, executing the write sequence according to the first embodiment or the second embodiment may be taken into consideration. These conductive layers 110 face a region (sixth region) near the lower end of the semiconductor region $120_L$. When any of $n_{LB}$ ($n_{LB}$ is a natural number) conductive layers 110 counted from the top is selected as the selected word line $WL_S$ among the plurality of conductive layers 110 in the device layer $DL_L$, executing the write sequence according to the first embodiment or the second embodiment may be taken into consideration. These conductive layers 110 face a region (fifth region) near the upper end of the semiconductor region $120_L$. When any of $n_{LC}$ ($n_{LC}$ is a natural number larger than $n_{LA}$ and $n_{LB}$) conductive layers 110 provided between these is selected as the selected word line $WL_S$, executing the higher-speed write sequence may be taken into consideration. These conductive layers 110 face apart of the region (fourth region) of the semiconductor region $120_L$.

Likewise, for example, when any of $n_{UA}$ ($n_{UA}$ is a natural number) conductive layers 110 counted from the bottom is selected as the selected word line $WL_S$ among the plurality of conductive layers 110 in the device layer $DL_U$, executing the write sequence according to the first embodiment or the second embodiment may be taken into consideration. These conductive layers 110 face a region (third region) near the lower end of the semiconductor region $120_U$. When any of $n_{UB}$ ($n_{UB}$ is a natural number) conductive layers 110 counted from the top is selected as the selected word line $WL_S$ among the plurality of conductive layers 110 in the device layer $DL_U$, executing the write sequence according to the first embodiment or the second embodiment may be taken into consideration. These conductive layers 110 face a region (second region) near the upper end of the semiconductor region $120_U$. When any of $n_{UC}$ ($n_{UC}$ is a natural number larger than $n_{UA}$ and $n_{UB}$) conductive layers 110 provided between these is selected as the selected word line $WL_S$, executing the higher-speed write sequence may be taken into consideration. These conductive layers 110 face a part of the region (first region) of the semiconductor region $120_U$.

Figure 23:
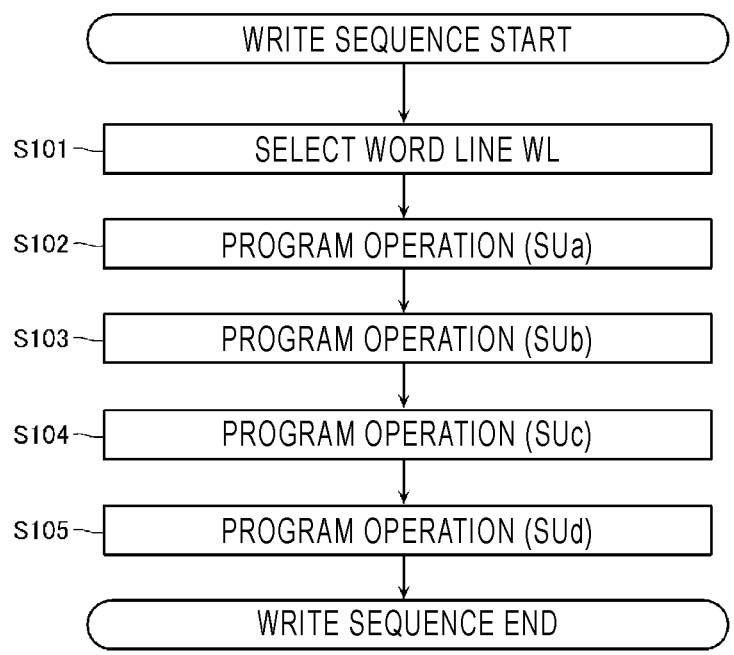
FIG. 23 is a flowchart illustrating a write sequence according to a third embodiment.
Figure 24:
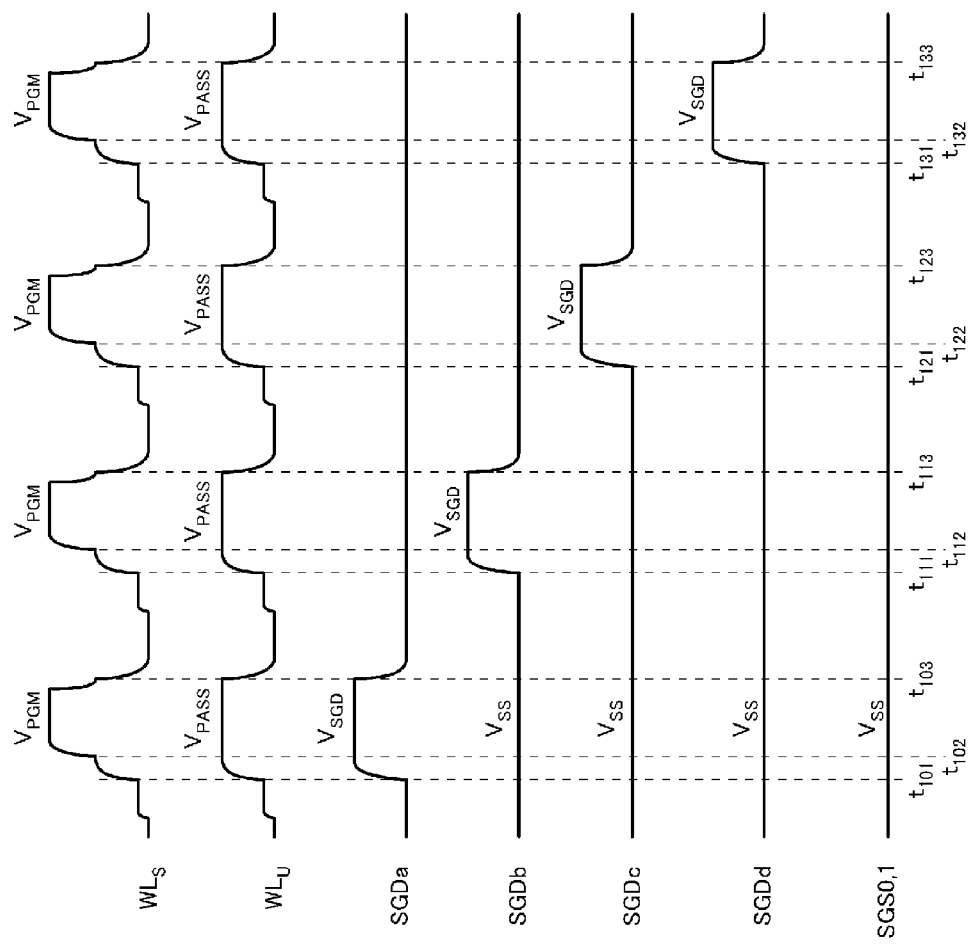
FIG. 24 is a schematic waveform diagram illustrating aspects of a write sequence according to a third embodiment.

FIG. 23 is a flowchart illustrating the higher-speed write sequence described above. FIG. 24 is a waveform diagram illustrating the higher-speed write sequence.

The write sequence illustrated in FIGS. 23 and 24 is similar to the write sequence according to the first embodiment, but this write sequence does not include steps subsequent to step S105, and is ended after step S105 is executed. That is, the verification operation is not executed on the write sequence illustrated in FIGS. 23 and 24.

Other Embodiments (a) In the embodiments described above, a program voltage may be applied to memory cells MC connected to a word line WL only once. This improves a writing speed.

(b) In the first embodiment, the verification operation is performed after the program operation on the string unit SUd is ended. In other examples, the verification operation may be performed after the program operation on any of the string units SUa, SUb, and SUc is ended. Accordingly, as in the first embodiment, it is possible to implement writing with high speed and high reliability.

(c) In the second embodiment, the verification operation is performed after the program operation on the string unit SUa and the string unit SUd is ended. In other examples, the verification operation may be performed after the program operation on any two string units among the string units SUa, SUb, SUc, and SUd is ended. Accordingly, as in the second embodiment, it is possible to implement writing with high speed and high reliability.

(d) The verification operation may be performed after the program operation on any three string units among four string units SUa, SUb, SUc, and SUd is ended. When the number of times of the verification operation is less than the number of string units by at least one, it is possible to implement writing with high speed and high reliability.

(e) In the embodiments described above, there are four string units SUa, SUb, SUc, and SUd. However, the number of string units is not limited to four. Even when the number of string units is increased to 5, 6, or more, it is possible to implement writing with high speed and a high reliability by performing the operation of the embodiments described above.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
    a first memory string including a first memory transistor and a first select transistor;
    a second memory string including a second memory transistor and a second select transistor;
    a word line connected to the first and second memory transistors;
    a first select gate line connected to the first select transistor;
    a second select gate line extending in a same layer level as the first select gate line and connected to the second select transistor; and
    a control circuit connected to the word line and the first and second select gate lines and configured to perform, during a write sequence:
        a program operation on each of the first and second memory transistors, respectively; and
        a verify operation on only one of the first and second memory transistors.

2. The semiconductor storage device according to claim 1, wherein
    during the program operation on the first memory transistor, the control circuit supplies a program voltage to the word line, turns on the first select transistor, and turns off the second select transistor, and
    during the program operation on the second memory transistor, the control circuit supplies the program voltage to the word line, turns on the second select transistor, and turns off the first select transistor.

3. The semiconductor storage device according to claim 2, wherein
    during the verify operation, the control circuit supplies a verify voltage to the word line, turns on one of the first and second select transistors that is connected to the one of the first and second memory transistors, and turns off the other one of the first and second select transistors.

4. The semiconductor storage device according to claim 1, wherein during the write sequence, the control circuit performs the verify operation after performing the program operations on both the first and second memory transistors.

5. The semiconductor storage device according to claim 1, wherein during the write sequence, the control circuit performs the verify operation after performing program operations on all of memory transistors connected to the word line.

6. The semiconductor storage device according to claim 1, wherein during the write sequence, the control circuit performs the verify operation only on one memory transistor connected to the word line.

7. The semiconductor storage device according to claim 1, wherein during the write sequence, the control circuit performs, in this order, the program operation on the first memory transistor, the verify operation on the first memory transistor, and the program operation on the second memory transistor.

8. The semiconductor storage device according to claim 7, wherein during the write sequence, the control circuit performs the program operation on all memory transistors connected to the word line, and the first memory transistor is the first one subjected to the program operation among the all of the memory transistors connected to the word line.

9. The semiconductor storage device according to claim 1, further comprising:
  a third memory string including a third memory transistor and a third select transistor;
  a fourth memory string including a fourth memory transistor and a fourth select transistor;
  a third select gate line extending in the same level as the first select gate line, and connected to the third select transistor; and
  a fourth select gate line extending in the same level as the first select gate line, and connected to the fourth select transistor, wherein
  the word line is connected to the third and fourth memory transistors, and
  during the write sequence, the control circuit performs program operations on each of the third and fourth memory transistors, respectively.

10. The semiconductor storage device according to claim 9, wherein during the write sequence, the control circuit performs the verify operation on neither the third nor the fourth memory transistor.

11. A method for controlling a semiconductor storage device including:
  a first memory string including a first memory transistor and a first select transistor;
  a second memory string including a second memory transistor and a second select transistor;
  a word line connected to the first and second memory transistors;
  a first select gate line connected to the first select transistor; and
  a second select gate line extending in a same layer level as the first select gate line and connected to the second select transistor, the method comprising, during a write sequence:
  carrying out a program operation on each of the first and second memory transistors, respectively; and
  carrying out a verify operation on only one of the first and second memory transistors.

12. The method according to claim 11, wherein
said carrying out the program operation on the first memory transistor comprises supplying a program voltage to the word line, turning on the first select transistor, and turning off the second select transistor, and
said carrying out the program operation on the second memory transistor comprises supplying the program voltage to the word line, turning on the second select transistor, and turning off the first select transistor.

13. The method according to claim 12, wherein
said carrying out the verify operation comprises supplying a verify voltage to the word line, turning on one of the first and second select transistors that is connected to the one of the first and second memory transistors, and turning off the other one of the first and second select transistors.

14. The method according to claim 11, wherein during the write sequence, the verify operation is carried out after performing the program operations on both the first and second memory transistors.

15. The method according to claim 11, wherein during the write sequence, the verify operation is carried out after performing program operations on all of memory transistors connected to the word line.

16. The method according to claim 11, wherein during the write sequence, the verify operation is carried out only on one memory transistor connected to the word line.

17. The method according to claim 11, wherein during the write sequence, the program operation on the first memory transistor, the verify operation on the first memory transistor, and the program operation on the second memory transistor are carried out in this order.

18. The method according to claim 17, wherein during the write sequence, the program operation is carried out on all memory transistors connected to the word line, and the first memory transistor is the first one subjected to the program operation among the all of the memory transistors connected to the word line.

19. The method according to claim 11, wherein the semiconductor storage device further includes:
  a third memory string including a third memory transistor and a third select transistor;
  a fourth memory string including a fourth memory transistor and a fourth select transistor;
  a third select gate line extending in the same level as the first select gate line, and connected to the third select transistor; and
  a fourth select gate line extending in the same level as the first select gate line, and connected to the fourth select transistor, wherein
  the word line is connected to the third and fourth memory transistors, and
  the method further comprises during the write sequence, carrying out program operations on each of the third and fourth memory transistors, respectively.

20. The method according to claim 19, wherein during the write sequence, the verify operation is carried out on neither the third nor the fourth memory transistor.

* * * * *